(12) United States Patent
Iguchi et al.

(10) Patent No.: US 11,908,847 B2
(45) Date of Patent: Feb. 20, 2024

(54) IMAGE DISPLAY ELEMENT AND METHOD FOR MANUFACTURING IMAGE DISPLAY ELEMENT

(71) Applicant: Sharp Fukuyama Laser Co., Ltd., Fukuyama (JP)

(72) Inventors: Katsuji Iguchi, Fukuyama (JP); Hidenori Kawanishi, Fukuyama (JP); Koji Takahashi, Fukuyama (JP); Hiroaki Onuma, Fukuyama (JP)

(73) Assignee: Sharp Fukuyama Laser Co., Ltd., Fukuyama (JP)

( * ) Notice: Subject to any disclaimer, the term of this patent is extended or adjusted under 35 U.S.C. 154(b) by 376 days.

(21) Appl. No.: 17/097,554

(22) Filed: Nov. 13, 2020

(65) Prior Publication Data

US 2021/0151422 A1    May 20, 2021

(30) Foreign Application Priority Data

Nov. 18, 2019   (JP) .................... 2019-208217

(51) Int. Cl.
| | |
|---|---|
| *H01L 25/16* | (2023.01) |
| *H01L 33/00* | (2010.01) |
| *H01L 33/60* | (2010.01) |
| *H01L 33/40* | (2010.01) |
| *H01L 33/50* | (2010.01) |
| *H01L 33/42* | (2010.01) |
| *H01L 33/32* | (2010.01) |

(52) U.S. Cl.
CPC ........ *H01L 25/167* (2013.01); *H01L 33/0093* (2020.05); *H01L 33/0095* (2013.01); *H01L 33/405* (2013.01); *H01L 33/42* (2013.01); *H01L 33/50* (2013.01); *H01L 33/60* (2013.01); *H01L 33/0075* (2013.01); *H01L 33/32* (2013.01); *H01L 2933/0041* (2013.01); *H01L 2933/0058* (2013.01)

(58) Field of Classification Search
CPC combination set(s) only.
See application file for complete search history.

(56) References Cited

U.S. PATENT DOCUMENTS

| | | | |
|---|---|---|---|
| 11,742,339 B2 * | 8/2023 | Zhang ................... | H01L 25/167 372/38.02 |
| 2012/0087108 A1 * | 4/2012 | Ke ...................... | H01L 25/0753 257/E33.012 |

(Continued)

FOREIGN PATENT DOCUMENTS

| | | |
|---|---|---|
| JP | H0529648 A | 2/1993 |
| JP | 2002-141492 A | 5/2002 |

(Continued)

*Primary Examiner* — Mark W Tornow
*Assistant Examiner* — Priya M Rampersaud
(74) *Attorney, Agent, or Firm* — ScienBiziP, P.C.

(57) ABSTRACT

An image display element includes micro light emitting elements disposed in an array on a driving circuit substrate. An excitation light emitting element includes a main body including a compound semiconductor, a metal electrode disposed on a side of the main body located closer to the driving circuit substrate, and a transparent electrode disposed on an opposite side to the driving circuit substrate, and a light emission layer included in the main body is disposed on a side opposite to the driving circuit substrate from a center portion of the main body.

18 Claims, 34 Drawing Sheets

(56) References Cited

U.S. PATENT DOCUMENTS

| | | | | |
|---|---|---|---|---|
| 2018/0090058 A1* | 3/2018 | Chen | ........................ | G09G 3/32 |
| 2019/0115333 A1* | 4/2019 | Wu | ........................ | H01L 33/54 |
| 2019/0371779 A1* | 12/2019 | Yeon | ........................ | H01L 25/18 |
| 2020/0144458 A1* | 5/2020 | Lee | ........................ | H01L 33/504 |

FOREIGN PATENT DOCUMENTS

| | | |
|---|---|---|
| JP | 2006196693 A | 7/2006 |
| JP | 2006245165 A | 9/2006 |
| JP | 2017117814 A | 6/2017 |

\* cited by examiner (23-6) REDUNDANCY (23-7) WAVELENGTH CONVERSION PORTION FORMATION 22C : CONNECTION PORTION
22D : CUTTING PORTION
31 : TRANSPARENT PORTION
32 : RED WAVELENGTH CONVERSION PORTION
33 : GREEN WAVELENGTH CONVERSION PORTION

IMAGE DISPLAY ELEMENT AND METHOD FOR MANUFACTURING IMAGE DISPLAY ELEMENT

CROSS-REFERENCE TO RELATED APPLICATION

The present application claims priority from Japanese Application JP2019-208217, the content to which is hereby incorporated by reference into this application.

BACKGROUND OF THE INVENTION

1. Field of the Invention

The disclosure relates to an image display element including a micro light emitting element and a method for manufacturing the image display element.

2. Description of the Related Art

Display elements in which a plurality of micro light emitting elements constituting pixels are disposed on a driving circuit substrate have been proposed. For example, in the technique disclosed in JP 2002-141492 A, a driving circuit is formed on a silicon substrate, and a micro light emitting diode (µLED) array that emits ultraviolet light is disposed on the driving circuit. In the technique, a small display element is disclosed that displays a color image by providing a wavelength conversion portion on the light emitting diode array that converts ultraviolet light to red, green, and blue visible light.

As another example, in a display element disclosed in US 2018/0,090,058 A1, micro light emitting diodes (µLED) that emit blue, green, and red light or another color of light are disposed in an array on top of the driving circuit and the µLED is surrounded by a reflective wall (micro-reflector). In such a configuration, it is practically difficult to dispose µLEDs with RGB 3 colors in one pixel, and thus, a single color display element has been developed.

Such display elements have characteristics such as small, high brightness, and high durability. Therefore, such display elements are expected to be display elements for display devices such as glasses-like devices or Head-Up Displays (HUDs).

Since the material of the driving circuit substrate and the material of the micro light emitting element are different, a method of separately forming the driving circuit substrate and the micro light emitting element and then bonding them is generally used as a method of manufacturing such a display element.

SUMMARY OF THE INVENTION

A method for configuring a full color display element by combining a wavelength conversion material such as that described in PTL 1 into a pixel configured by a reflective wall and a µLED such as that disclosed in PTL 2 is envisaged. In particular, in a case where a gap between the µLED and the reflective wall surrounding the µLED is filled with the wavelength conversion material, all surfaces other than the bottom surface of the µLED (the surface closer to the silicon substrate constituting the driving circuit) can be covered by the wavelength conversion material. Accordingly, it is expected to significantly increase the wavelength conversion efficiency.

However, in such a structure, in a case where the light emission efficiency is attempted to be increased, the µLED needs to be smaller. As the size of the µLED decreases, the internal quantum efficiency of the µLED is reduced due to damage caused during the µLED processing, resulting in a problem in that the expected light emission efficiency cannot be achieved. In a case where the µLED is small, in the step of processing the µLED, the majority of the compound semiconductor layer constituting the µLED is lost. As a result, a problem in that the efficiency of utilizing the compound semiconductor layer is very low arises.

One aspect of the disclosure has been made in view of these problems, and an object of the disclosure is to improve the light emission efficiency and reduce power consumption in a display element including a micro light emitting element including a wavelength conversion material disposed between the µLED and the reflective wall surrounding the µLED. Furthermore, an object of the disclosure is to provide a manufacturing method that can provide the increased efficiency of utilizing the compound semiconductor layer constituting the µLED.

To solve the above problem, (1) an embodiment of the disclosure is an image display element including micro light emitting elements disposed in an array on a driving circuit substrate including a driving circuit configured to supply a current to the micro light emitting elements and cause the light emitting elements to emit light,
  wherein each of the micro light emitting elements emits light in a direction opposite to the driving circuit substrate,
  each of the micro light emitting elements includes an excitation light emitting element configured to generate excitation light, a reflective wall surrounding a periphery of the excitation light emitting element, and a wavelength conversion material disposed inside the reflective wall,
  a sidewall of the reflective wall is inclined to open with respect to a light emission direction of each of the micro light emitting elements,
  the wavelength conversion material absorbs the excitation light and emits light having a wavelength longer than a wavelength of the excitation light,
  the wavelength conversion material covers all surfaces excluding a surface of the excitation light emitting element located closer to the driving circuit substrate,
  the excitation light emitting element includes a main body including a compound semiconductor, a metal electrode disposed on a side of the main body located closer to the driving circuit substrate, and a transparent electrode disposed on an opposite side to the driving circuit substrate, and
  a light emission layer included in the main body is disposed on a side opposite to the driving circuit substrate from a center portion of the main body.

(2) An embodiment of the disclosure is a method of manufacturing the image display element, including the following steps, which are performed according to the described order.
  (a) A compound semiconductor layer is deposited on a growth substrate.
  (b) A portion of the compound semiconductor layer is removed to form a separation trench, and a main body is formed between the separation trenches.
  (c) Damage to the compound semiconductor layer in which the separation trench is formed is recovered.
  (d) The surface of the compound semiconductor layer is bonded to a transfer substrate.

(e) The growth substrate is peeled off.
(f) The compound semiconductor layer is polished, the compound semiconductor layer of the separation trench is removed, and the main body is separated from each other.
(g) An electrode film is deposited on the surface where the main body of the transfer substrate is exposed.
(h) A surface of the transfer substrate located closer to the electrode film is bonded to a driving circuit substrate. At this time, both the substrates are aligned such that the main body overlaps with the drive electrode on the driving circuit substrate.
(i) The transfer substrate is peeled off.
(j) An excitation light emitting element including the main body is formed on the driving circuit substrate.
(k) A reflective wall surrounding the excitation light emitting element is formed.
(l) A wavelength conversion material is disposed inside the reflective wall.

By improving the light emission efficiency of the micro light emitting element, power consumption can be reduced. Furthermore, a full color display element with high efficiency and low power consumption can be easily formed. Manufacturing costs can be reduced by effectively using the compound semiconductor constituting the μLED.

Figure 4:
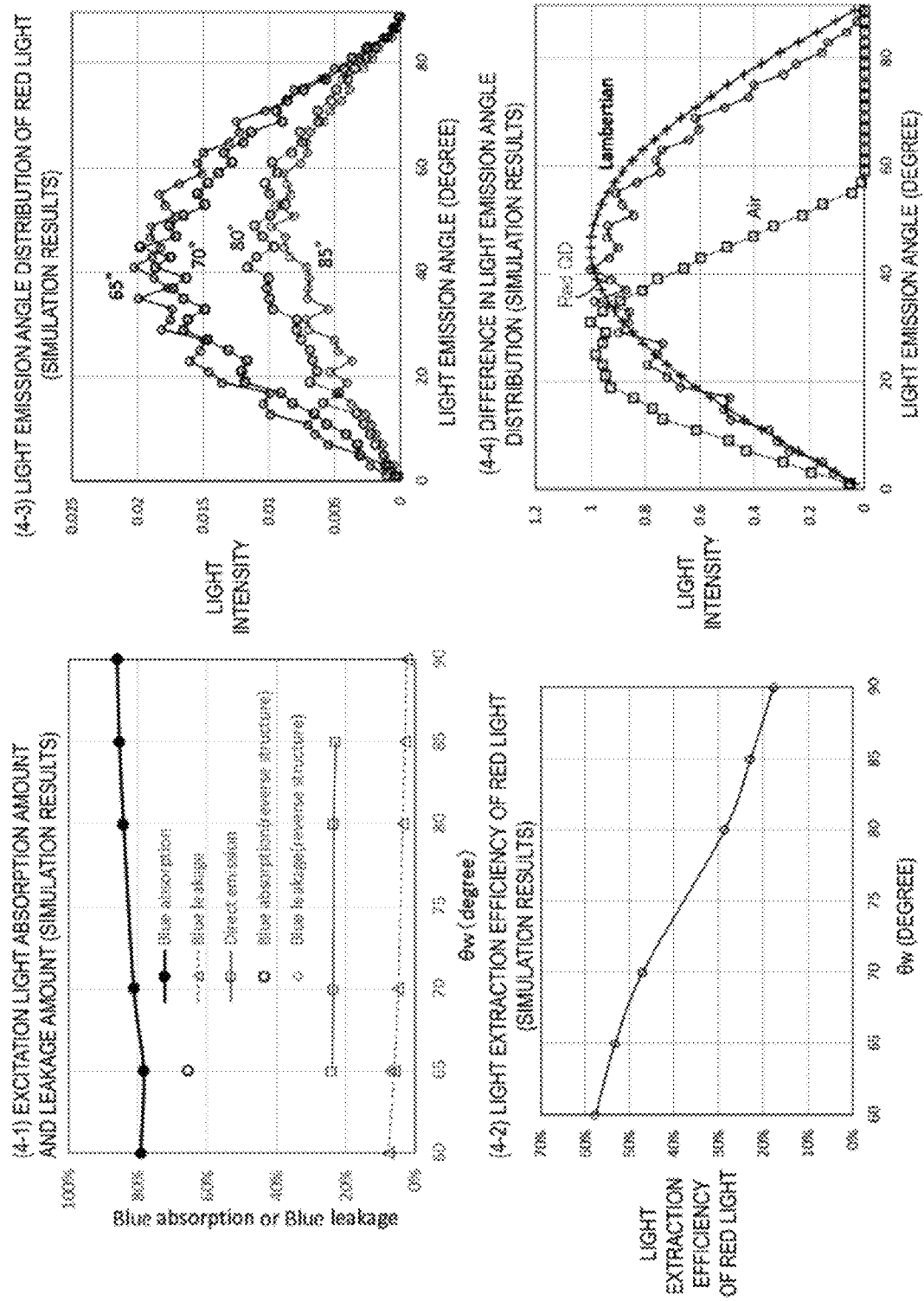

(4-1) of FIG. 4 is a diagram showing simulation results of excitation light absorption amount in a red wavelength conversion portion and excitation light leakage amount from a red wavelength conversion portion. (4-2) is a diagram showing a simulation result of the red light extraction efficiency from the red wavelength conversion portion. (4-3) is a diagram showing a simulation result of the emission angle dependency of red light. (4-4) is a diagram showing a simulation result comparing the emission angle dependencies of excitation light and red light.

Figure 5:
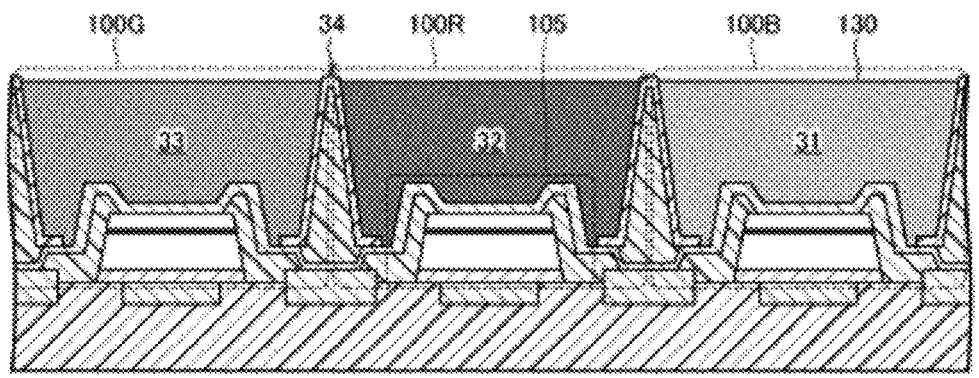

FIG. 5 is a cross-sectional schematic view of an image display element according to a second embodiment of the disclosure.

Figure 6:
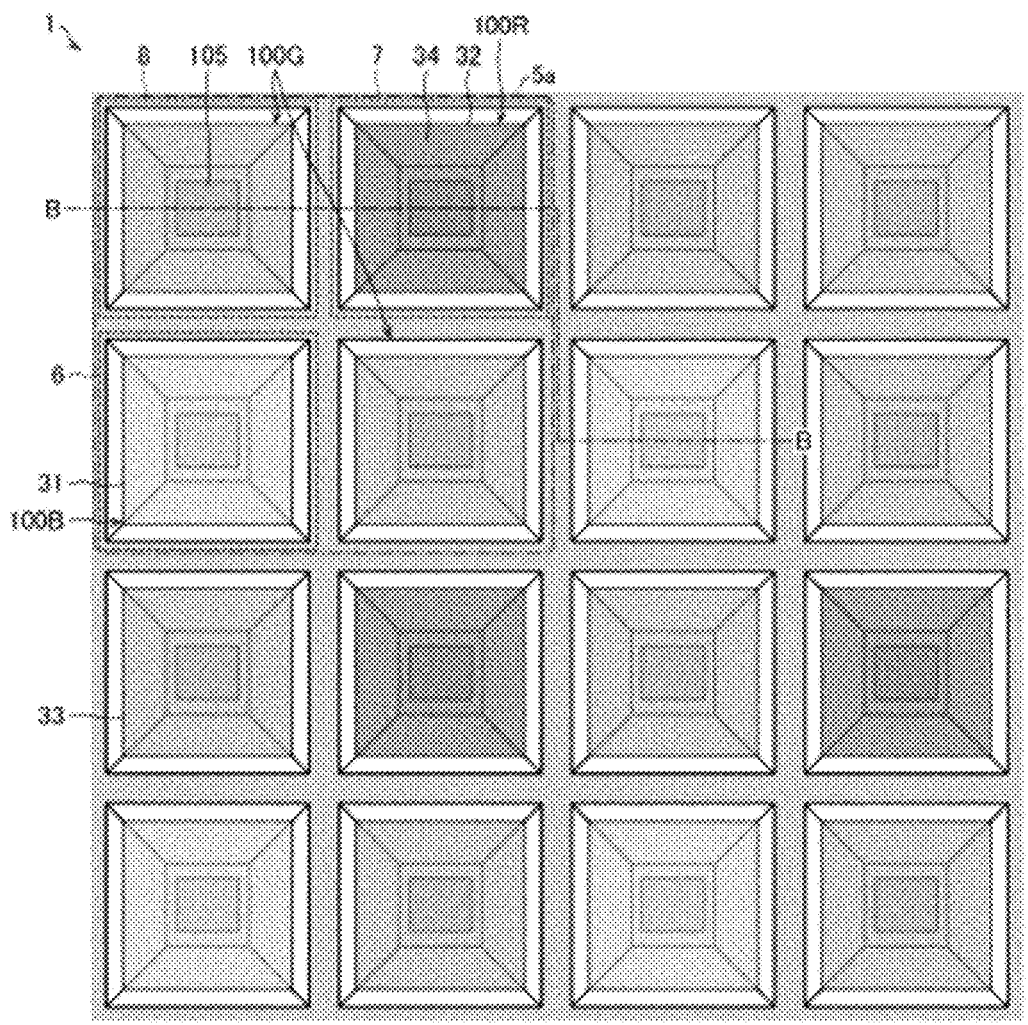

FIG. 6 is a schematic plan view of the image display element according to the second embodiment of the disclosure.

Figure 7:
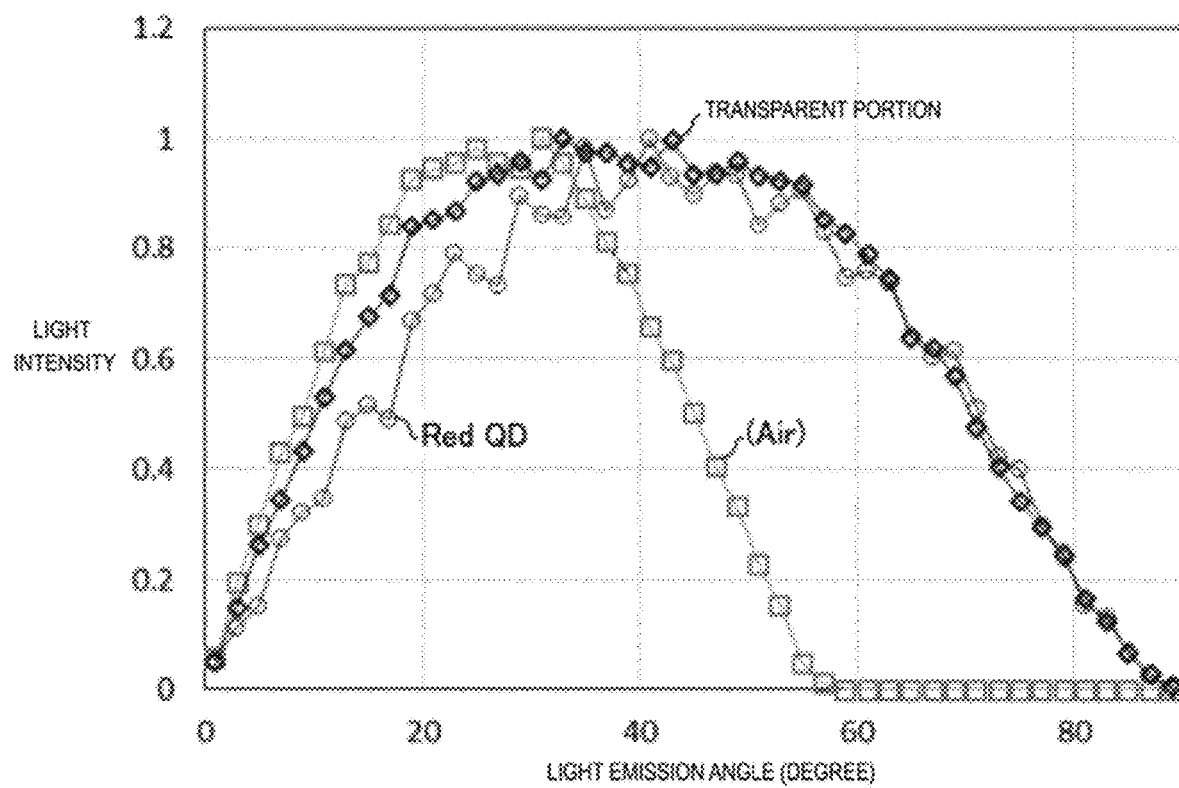

FIG. 7 is a diagram showing a simulation result comparing the emission angle dependencies of blue light emitted from a transparent portion, excitation light, and red light.

Figure 8:
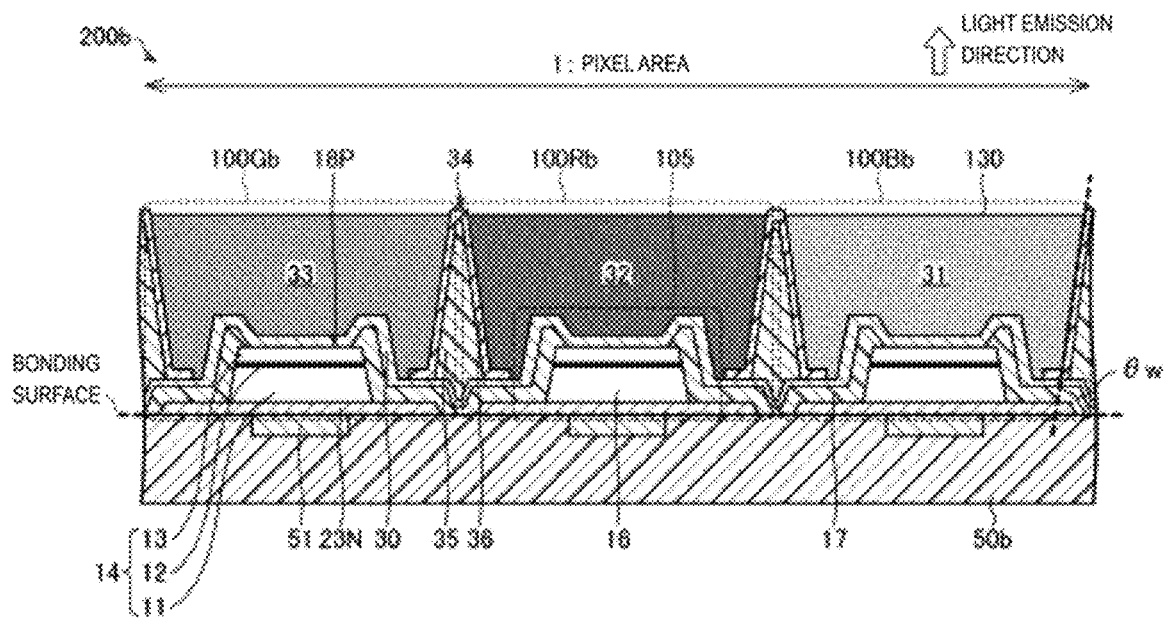

FIG. 8 is a cross-sectional schematic view of an image display element according to a third embodiment of the disclosure.

Figure 9A:
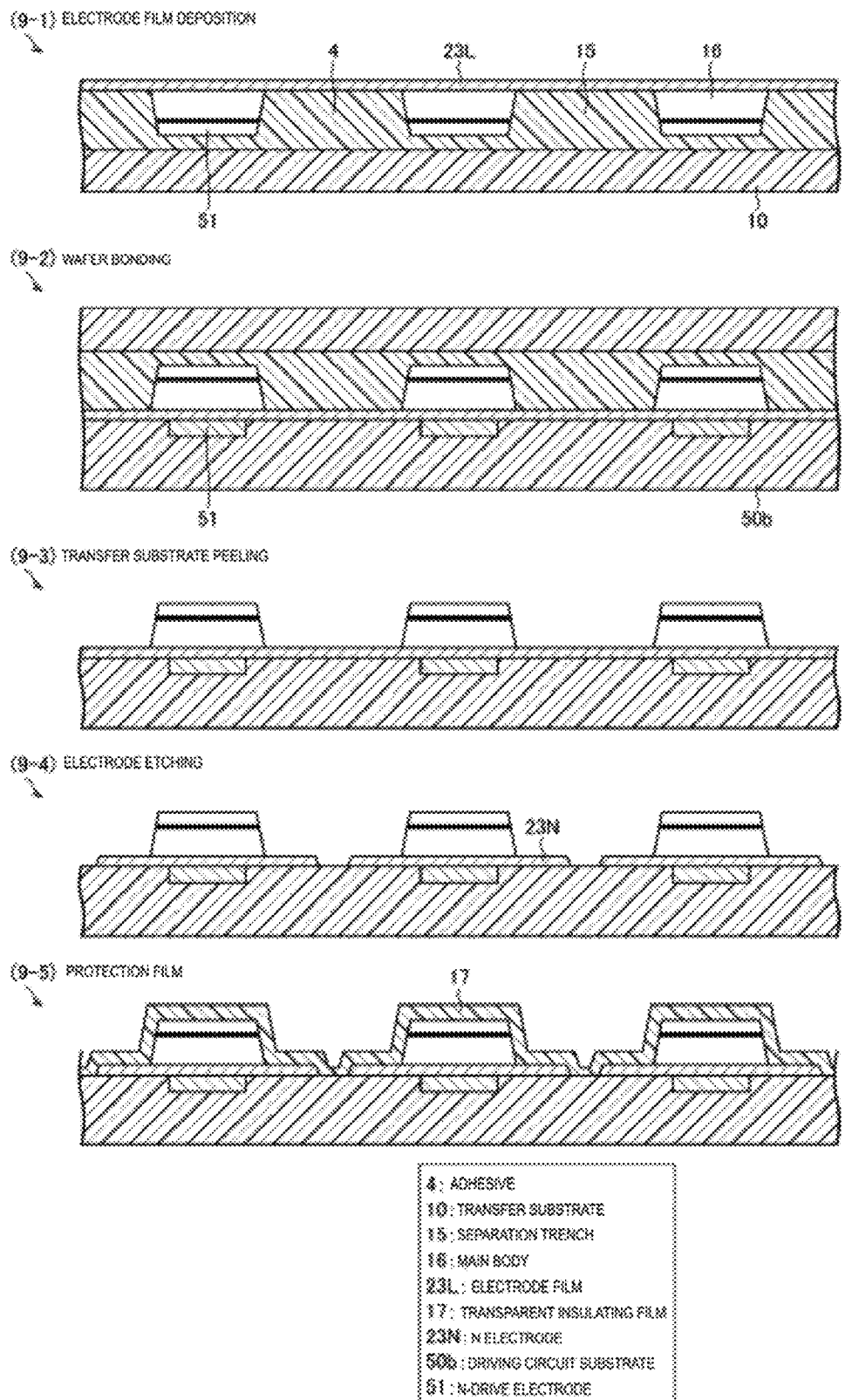

FIG. 9A is a cross-sectional schematic view illustrating a manufacturing process of the image display element according to the third embodiment of the disclosure.

Figure 9B:
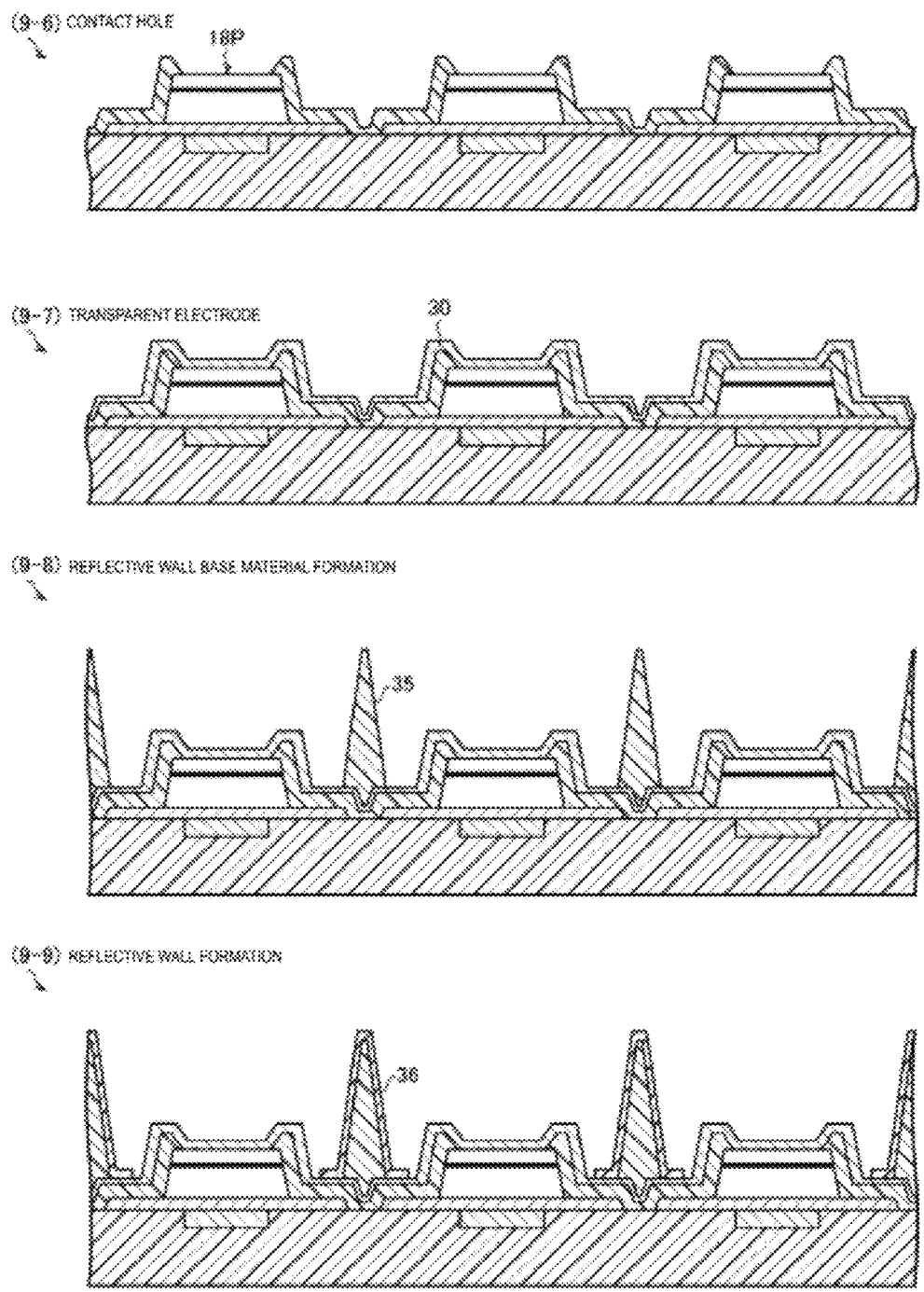

FIG. 9B is a cross-sectional schematic view illustrating a manufacturing process of the image display element.

Figure 9C:
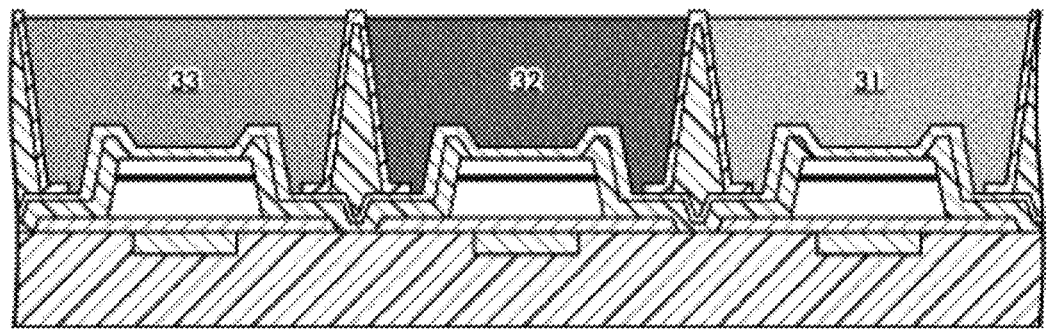

FIG. 9C is a cross-sectional schematic view illustrating a manufacturing process of the image display element.

Figure 10:
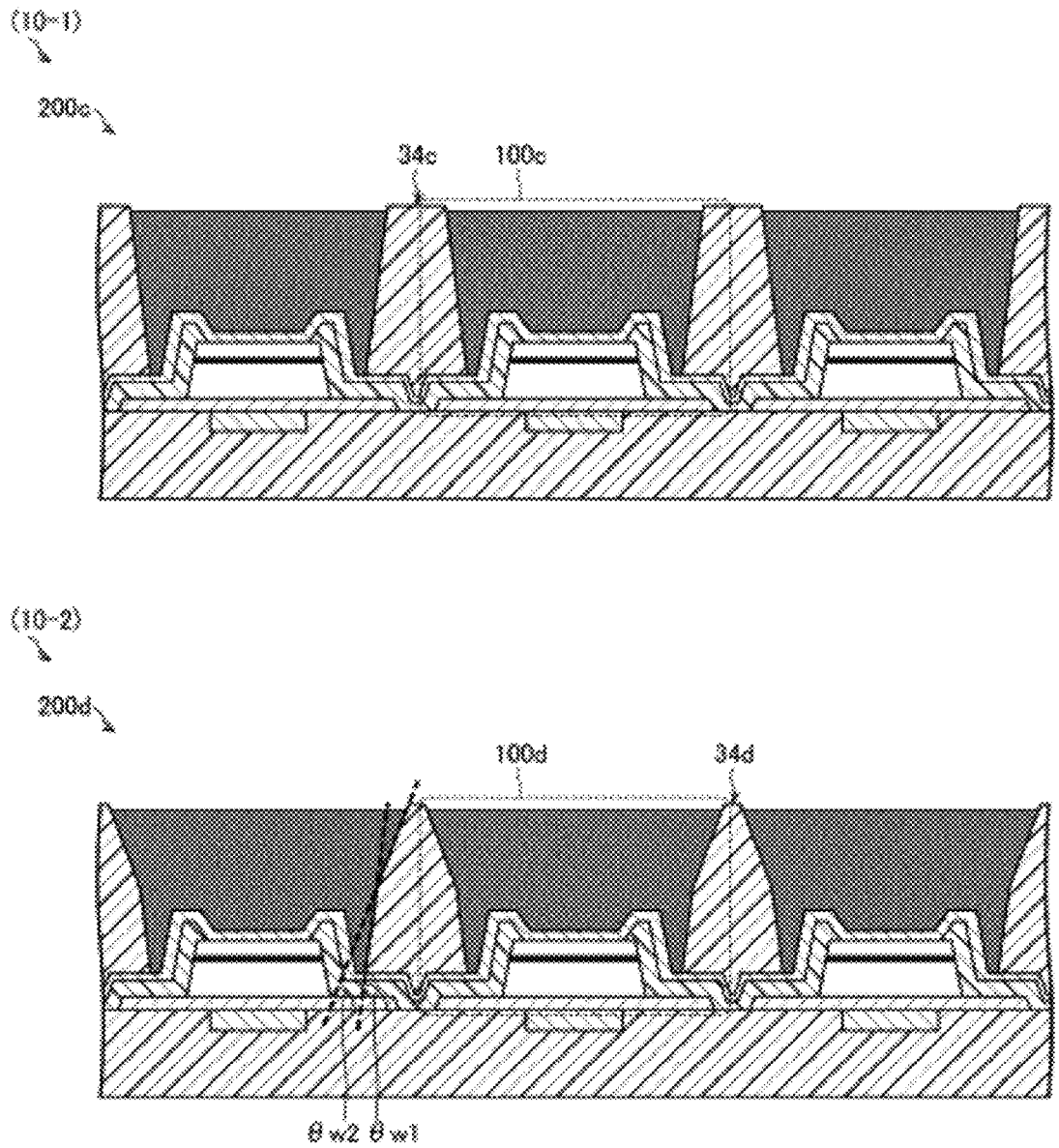

(10-1) and (10-2) of FIG. 10 are cross-sectional schematic views of modified examples of an image display element according to the third embodiment of the disclosure.

Figure 11:
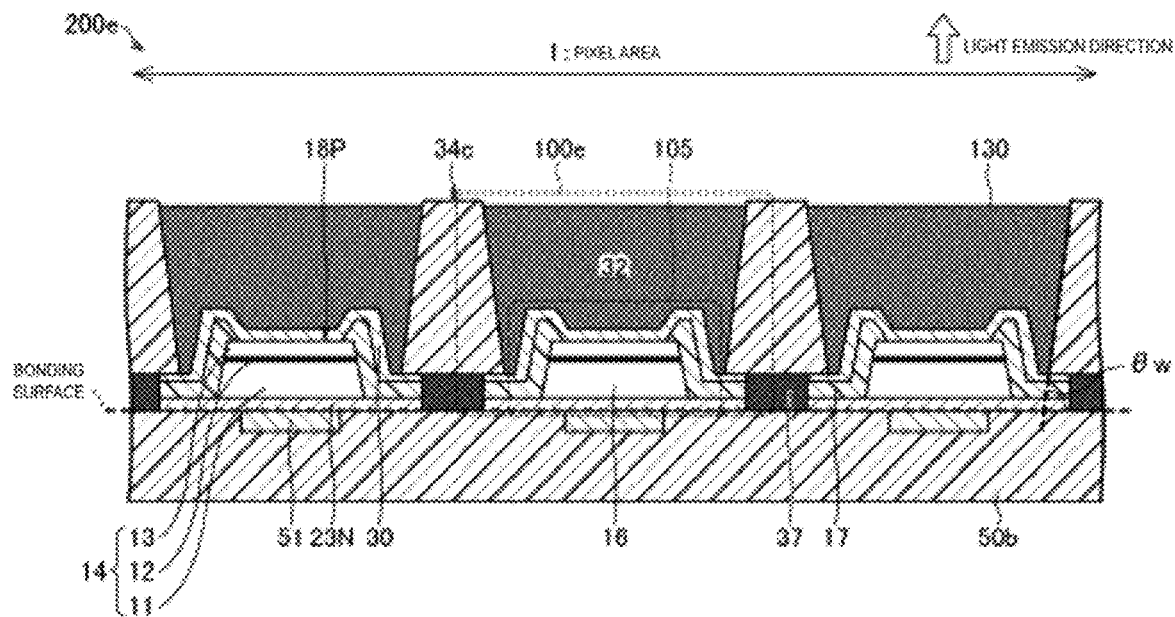

FIG. 11 is a cross-sectional schematic view of an image display element according to a fourth embodiment of the disclosure.

Figure 12A:
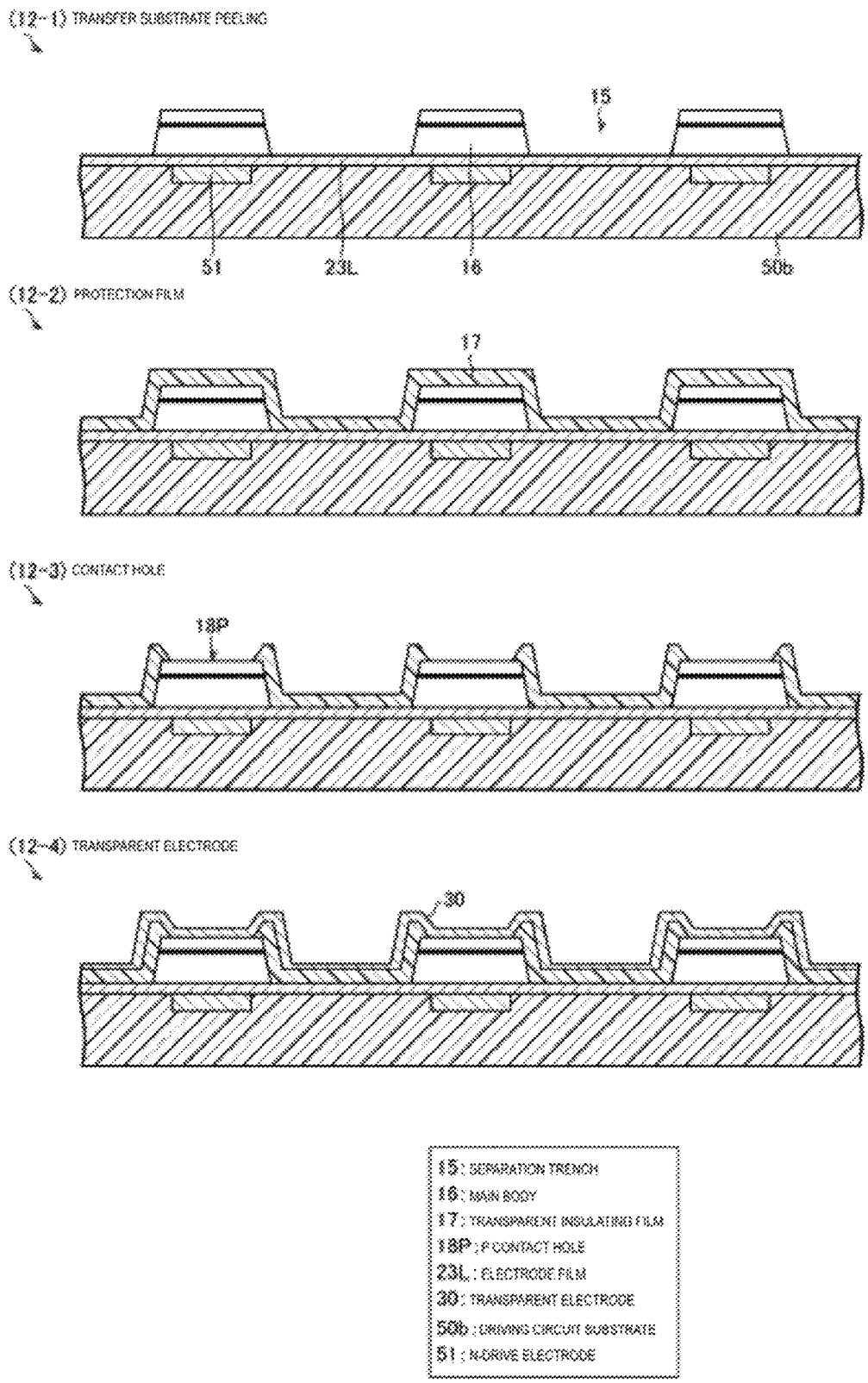

FIG. 12A is a cross-sectional schematic view illustrating a manufacturing process of the image display element according to the fourth embodiment of the disclosure.

Figure 12B:
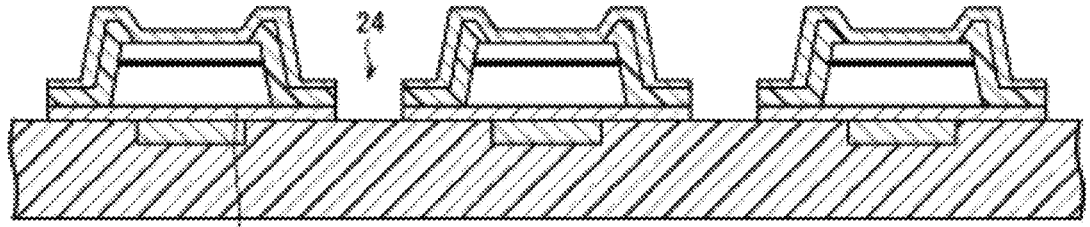
Figure 12B:
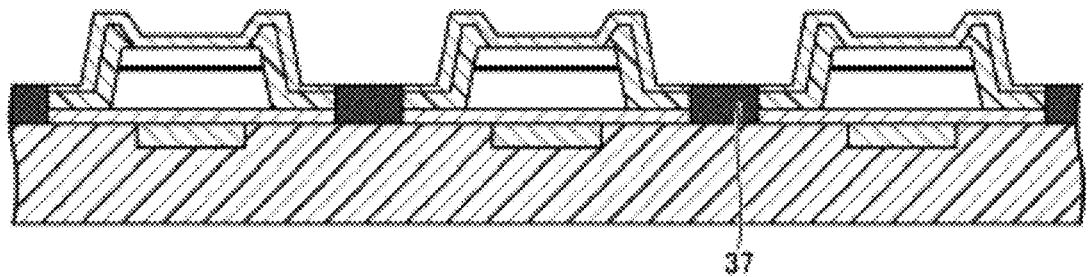
Figure 12B:
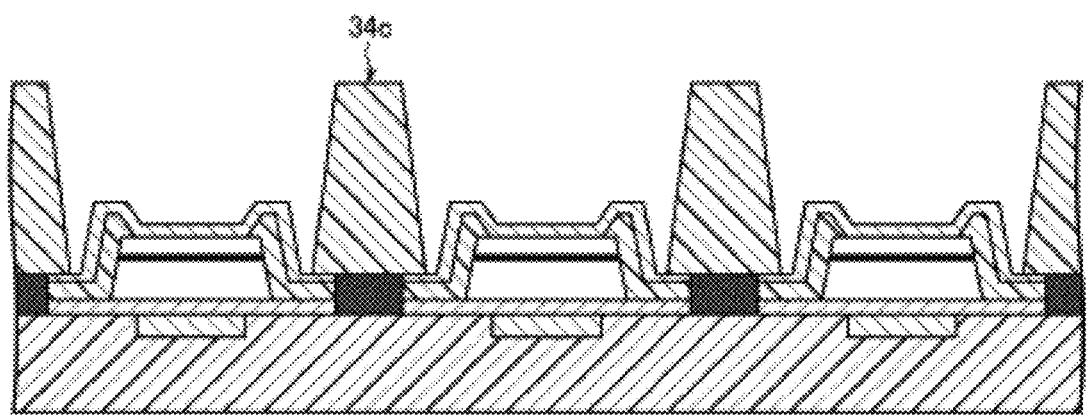

FIG. 12B is a cross-sectional schematic view illustrating a manufacturing process of the image display element.

Figure 13:
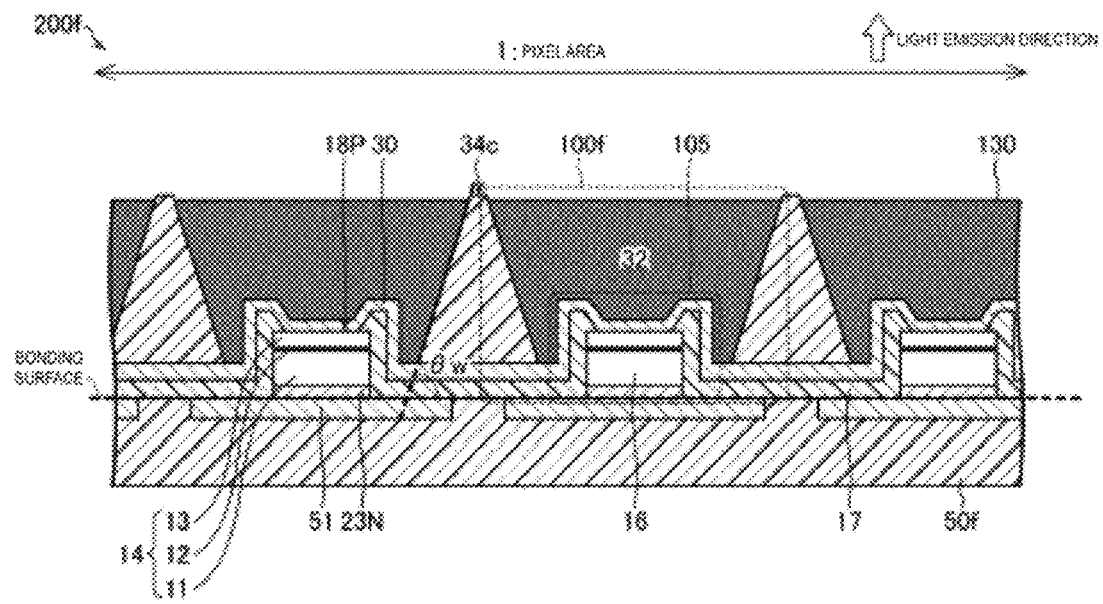

FIG. 13 is a cross-sectional schematic view of an image display element according to a fifth embodiment of the disclosure.

Figure 14A:
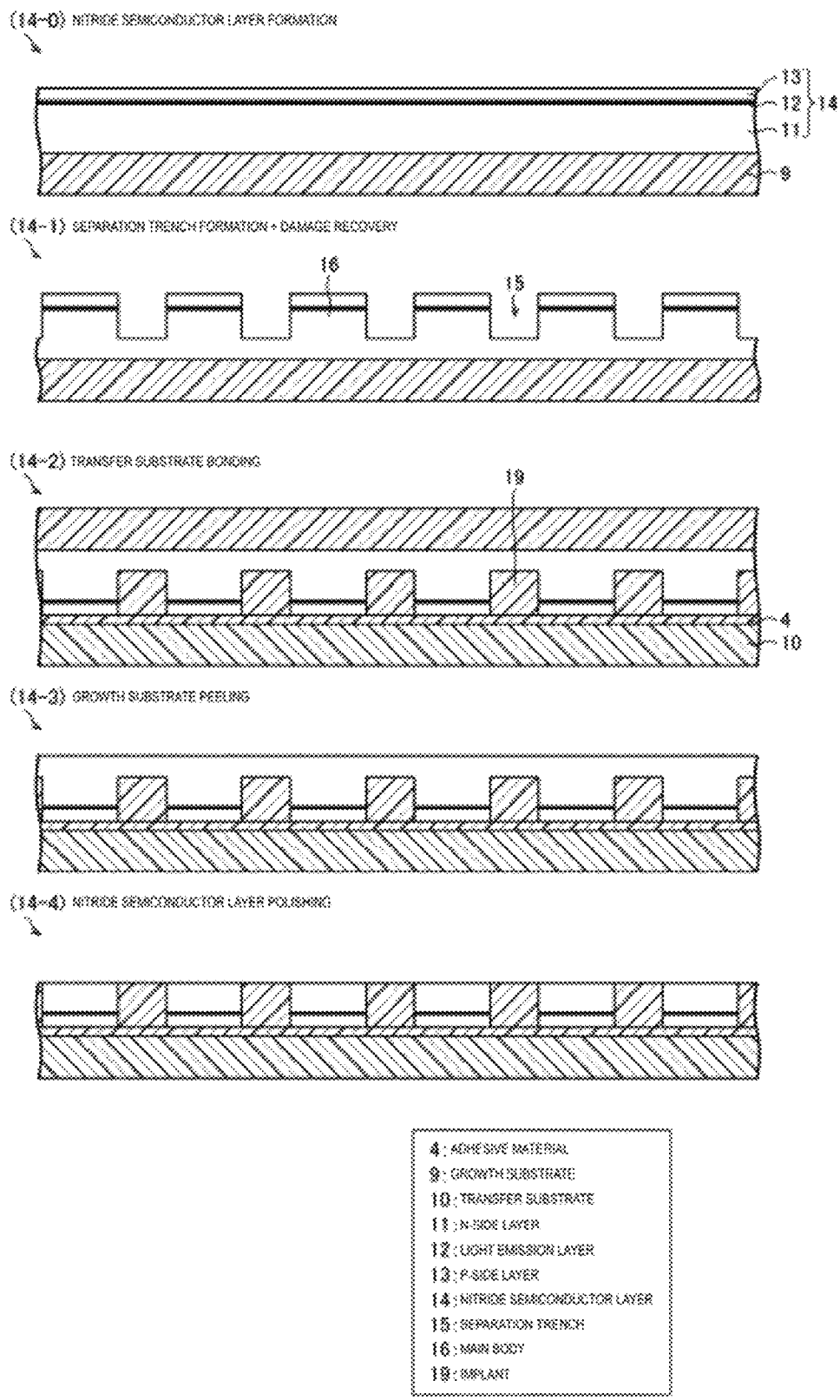

FIG. 14A is a cross-sectional schematic view illustrating a manufacturing process of the image display element according to the fifth embodiment of the disclosure.

Figure 14B:
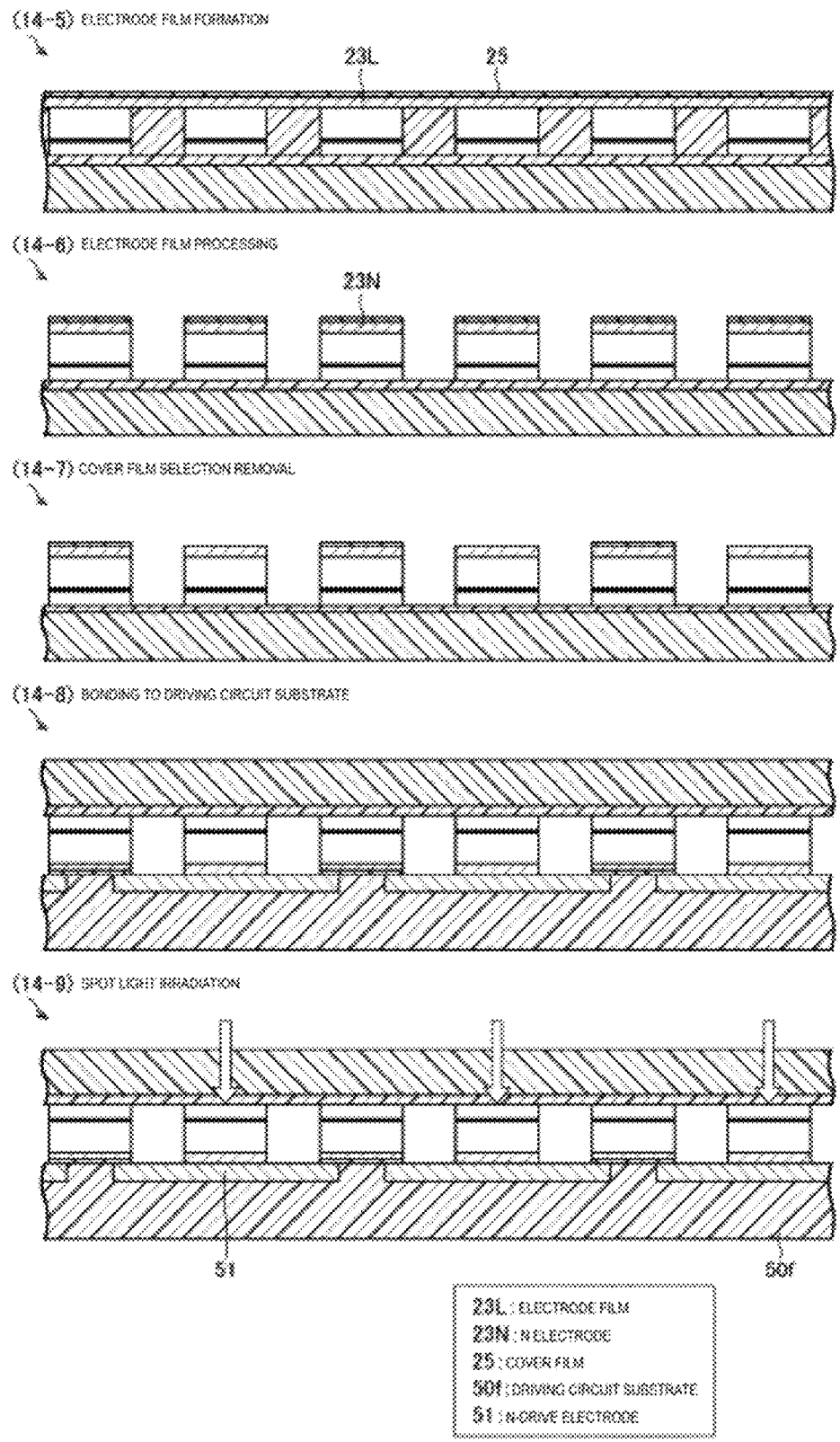

FIG. 14B is a cross-sectional schematic view illustrating a manufacturing process of the image display element.

Figure 14C:
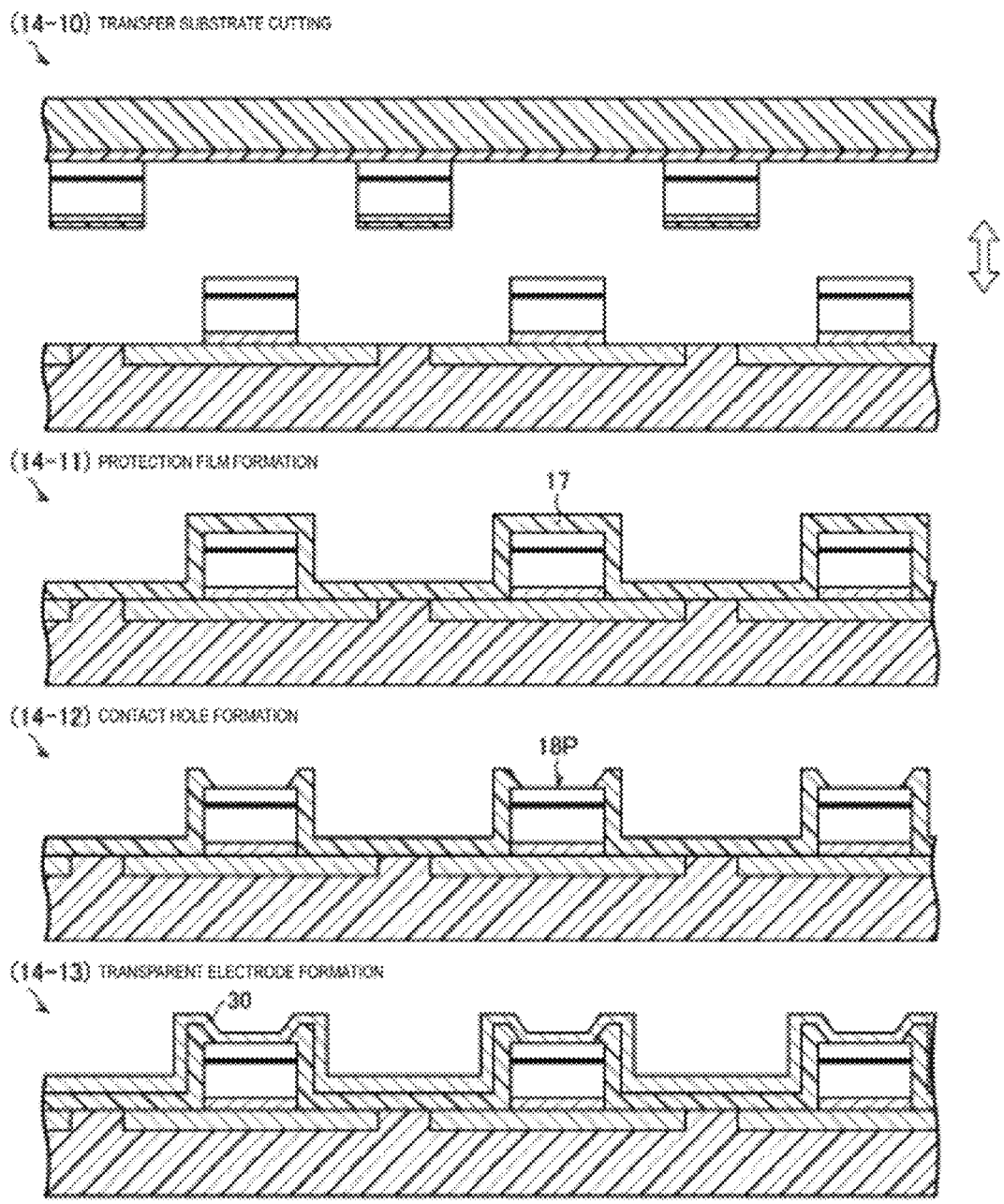

FIG. 14C is a cross-sectional schematic view illustrating a manufacturing process of the image display element.

Figure 14D:
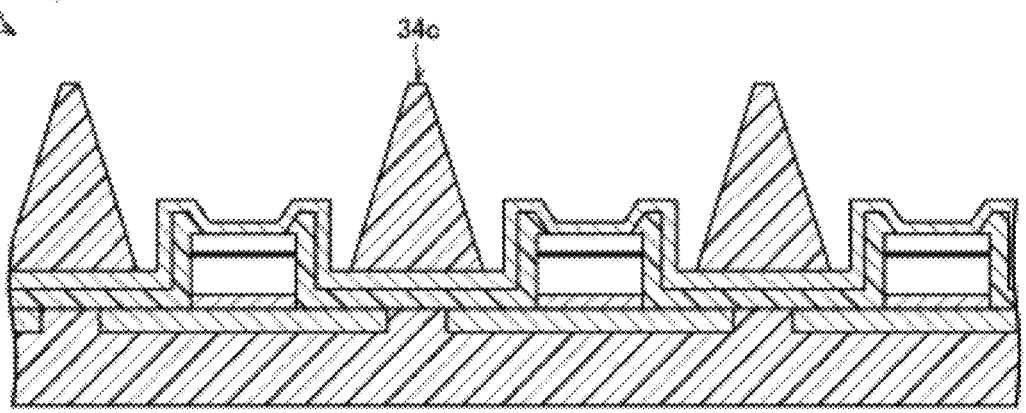
Figure 14D:
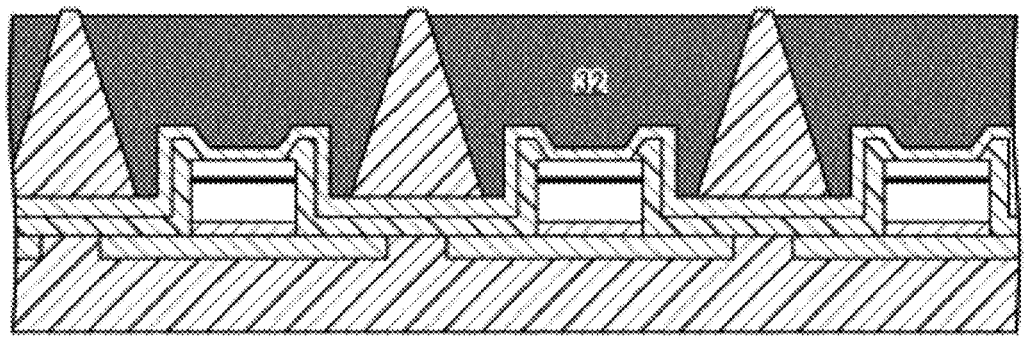

FIG. 14D is a cross-sectional schematic view illustrating a manufacturing process of the image display element.

Figure 15:
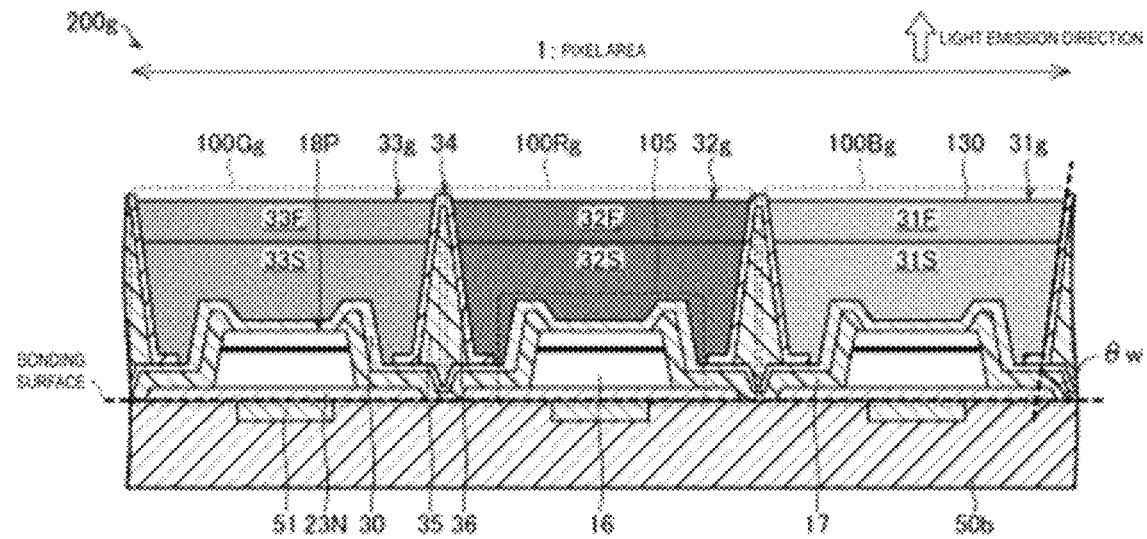

FIG. 15 is a cross-sectional schematic view of an image display element according to a sixth embodiment of the disclosure.

Figure 16:
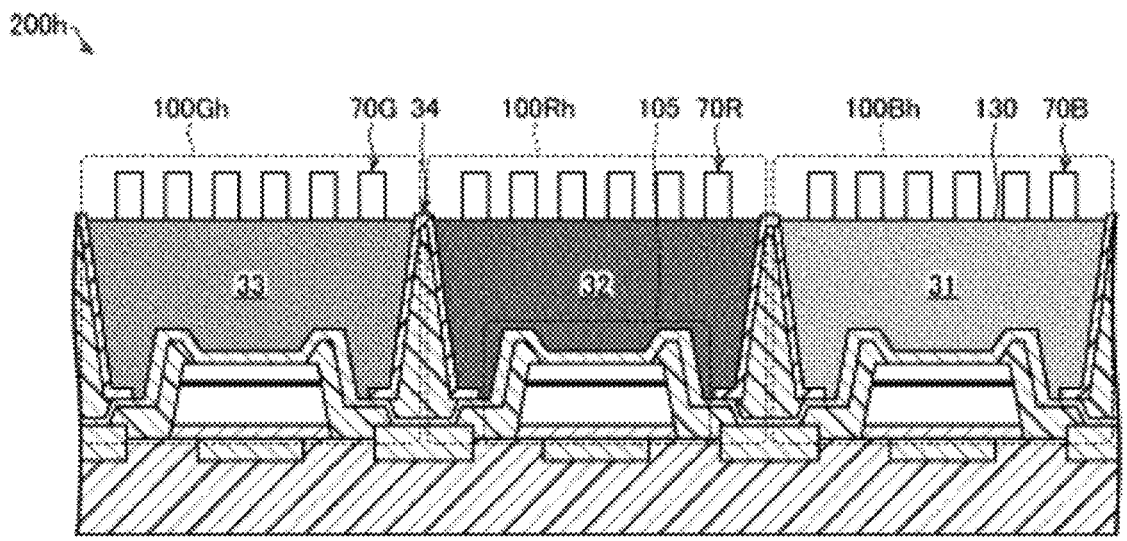

FIG. 16 is a cross-sectional schematic view of an image display element according to a seventh embodiment of the disclosure.

Figure 17:
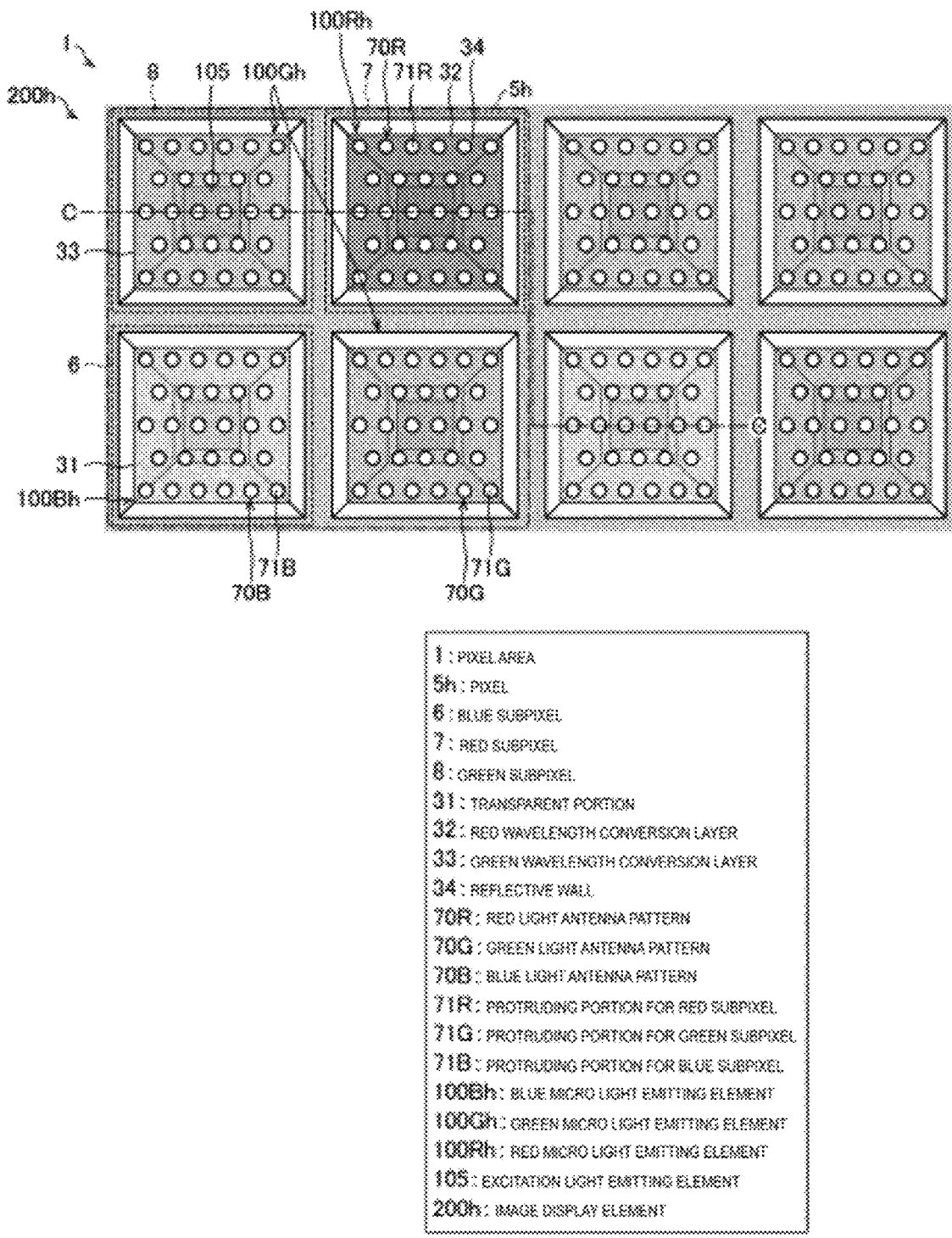

FIG. 17 is a schematic plan view of the image display element according to the seventh embodiment of the disclosure.

Figure 18:
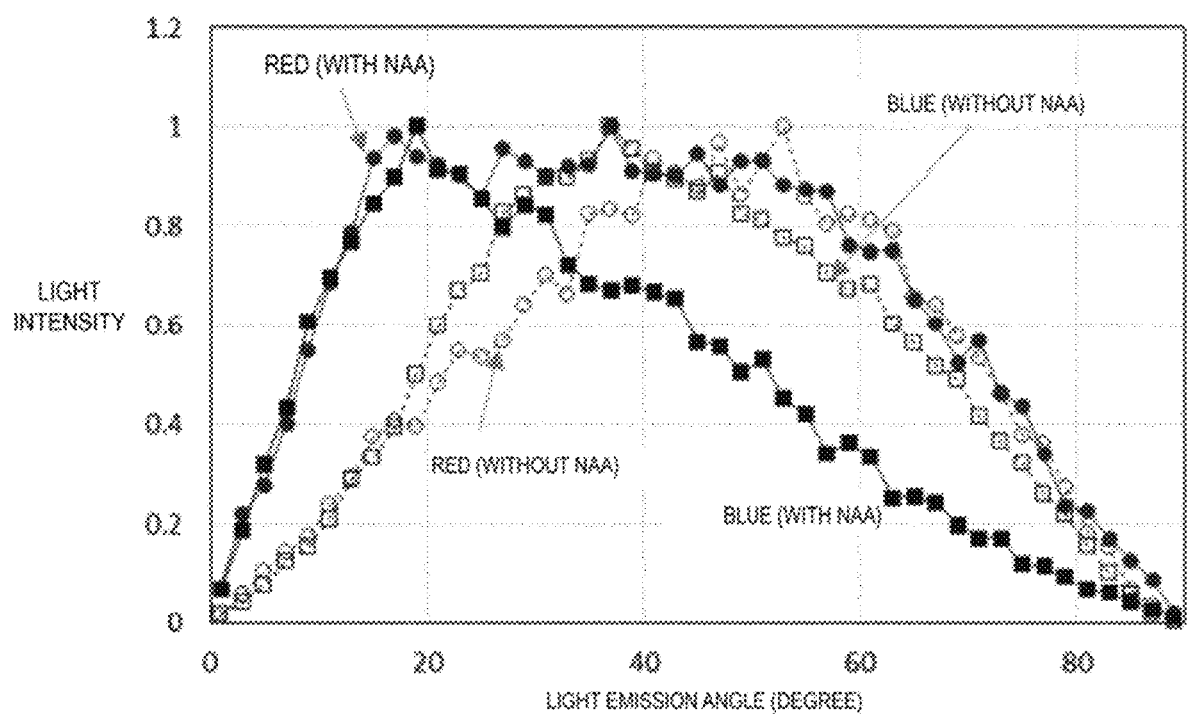

FIG. 18 is a diagram showing a simulation result comparing the emission angle dependencies of the blue light emitted from the transparent portion and the red light emitted from the red wavelength conversion portion with respect to the presence or absence of the nano-antenna array.

Figure 19:
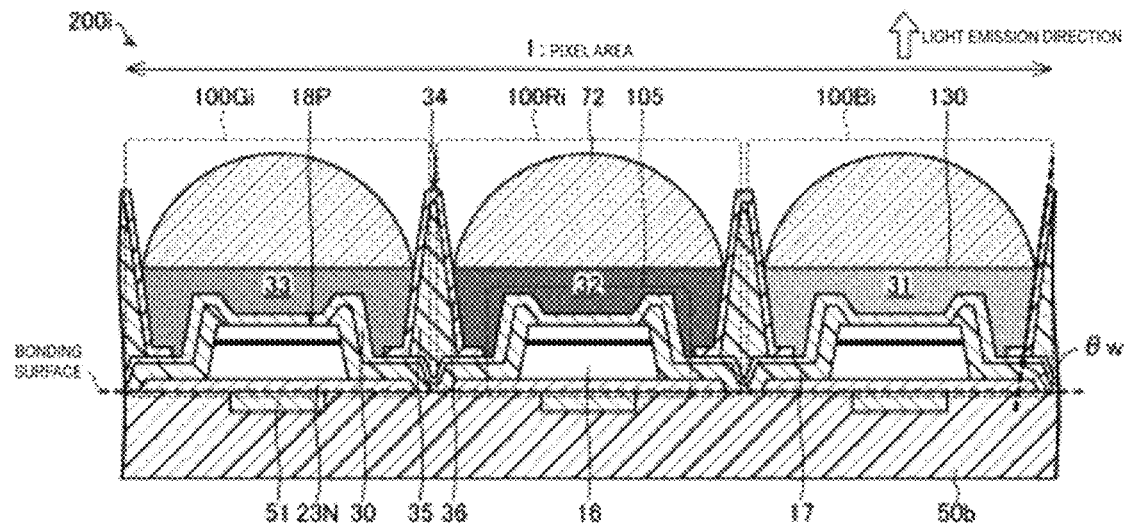

FIG. 19 is a cross-sectional schematic view of an image display element according to an eighth embodiment of the disclosure.

Figure 20:
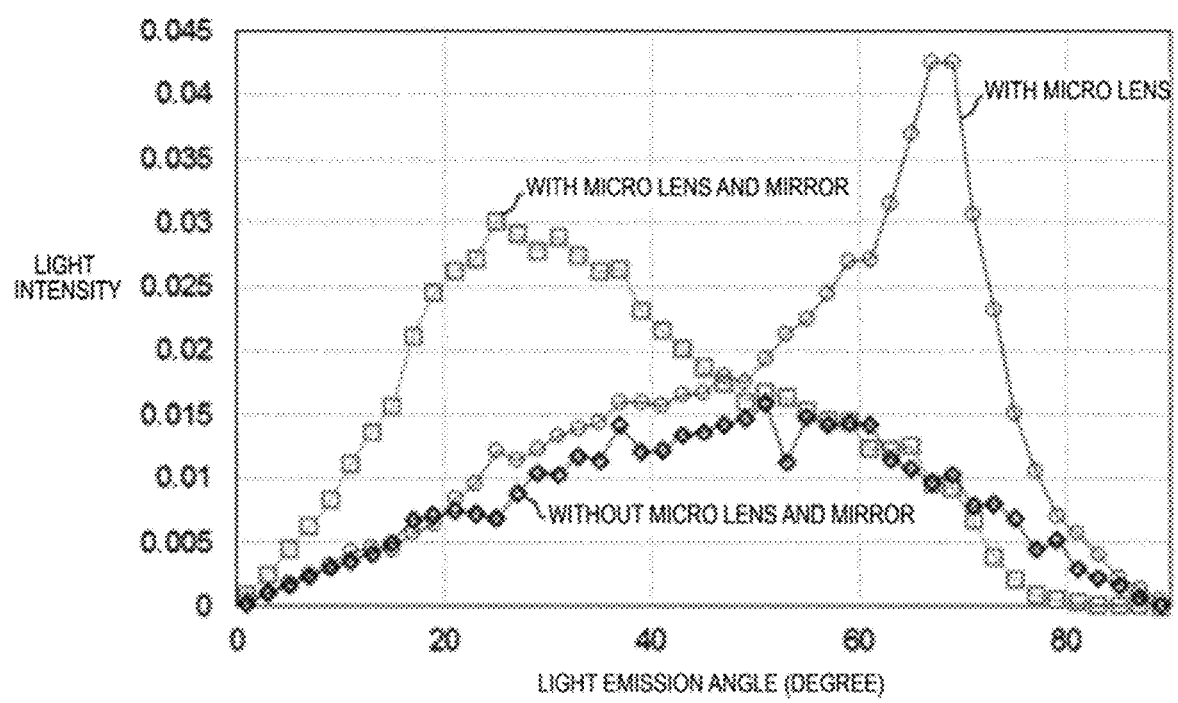

FIG. 20 is a diagram showing a simulation result comparing the emission angle dependencies of red light emitted from a red light emitting element with respect to the presence or absence of a micro lens and a reflective wall.

Figure 21:
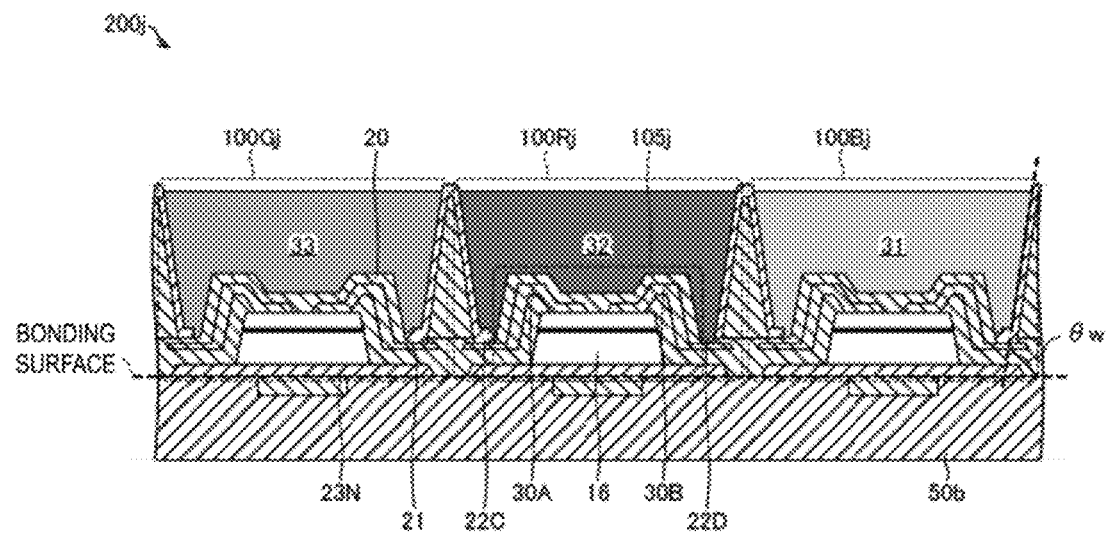

FIG. 21 is a cross-sectional schematic view of an image display element according to a ninth embodiment of the disclosure.

Figure 22:
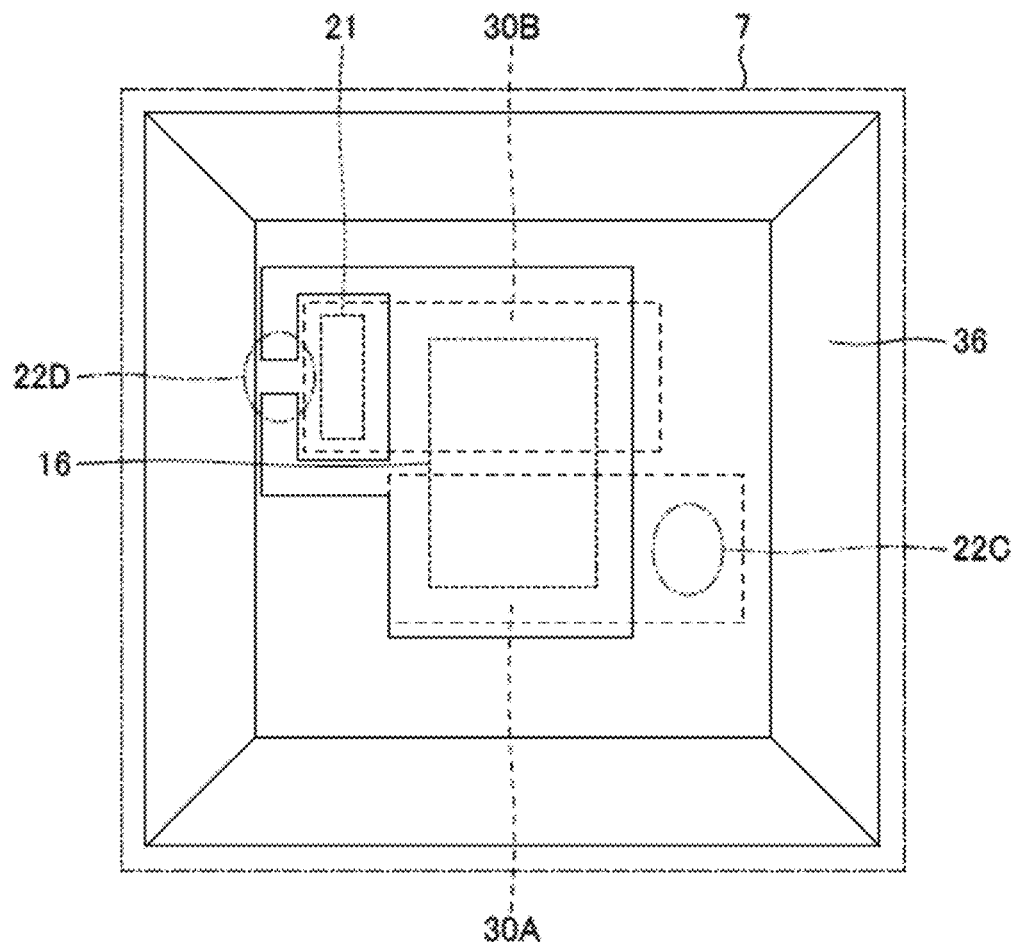

FIG. 22 is a schematic plan view of a subpixel according to the ninth embodiment of the disclosure.

Figure 23A:
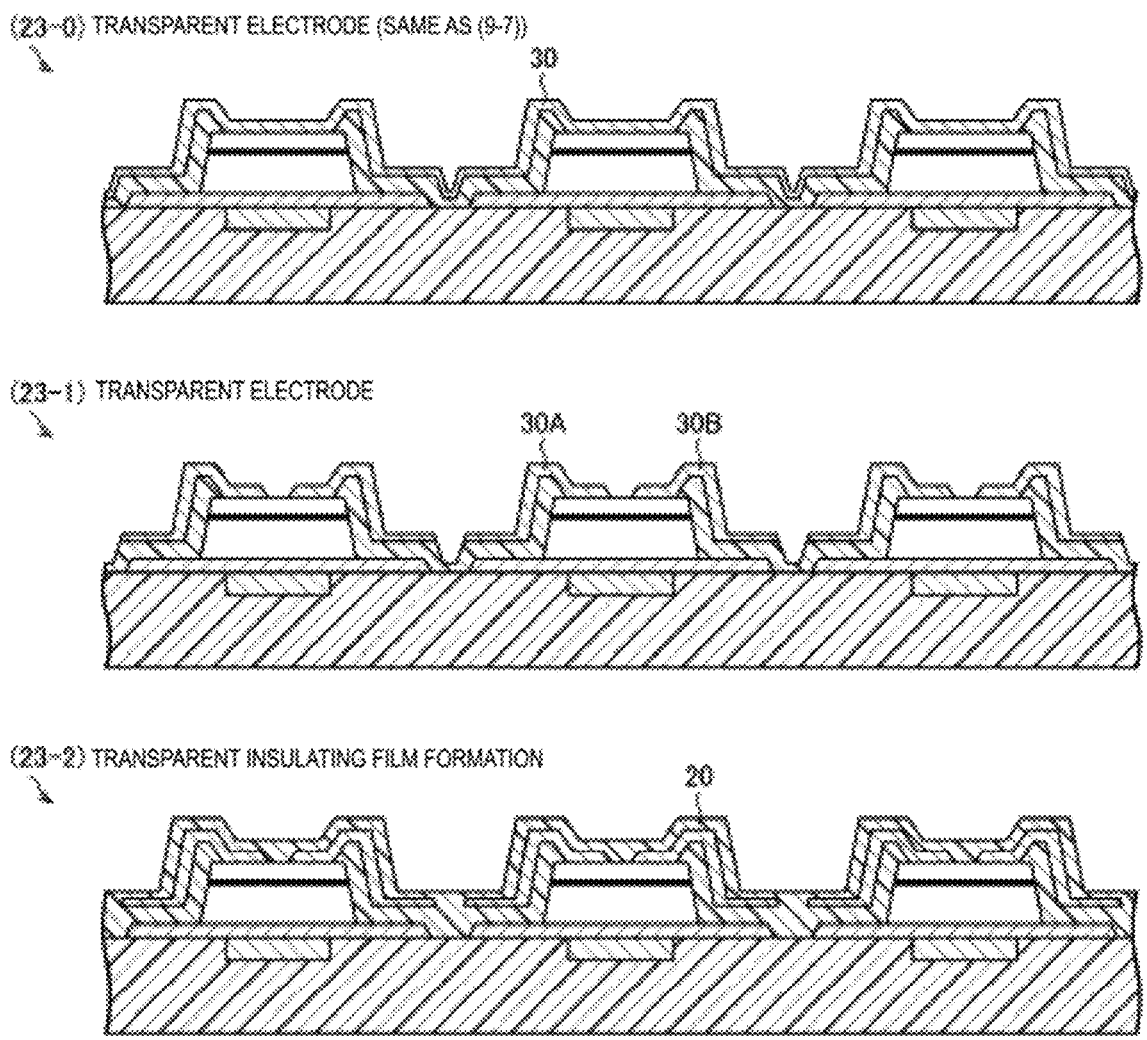

FIG. 23A is a cross-sectional schematic view illustrating a manufacturing process of the image display element according to the ninth embodiment of the disclosure.

Figure 23B:
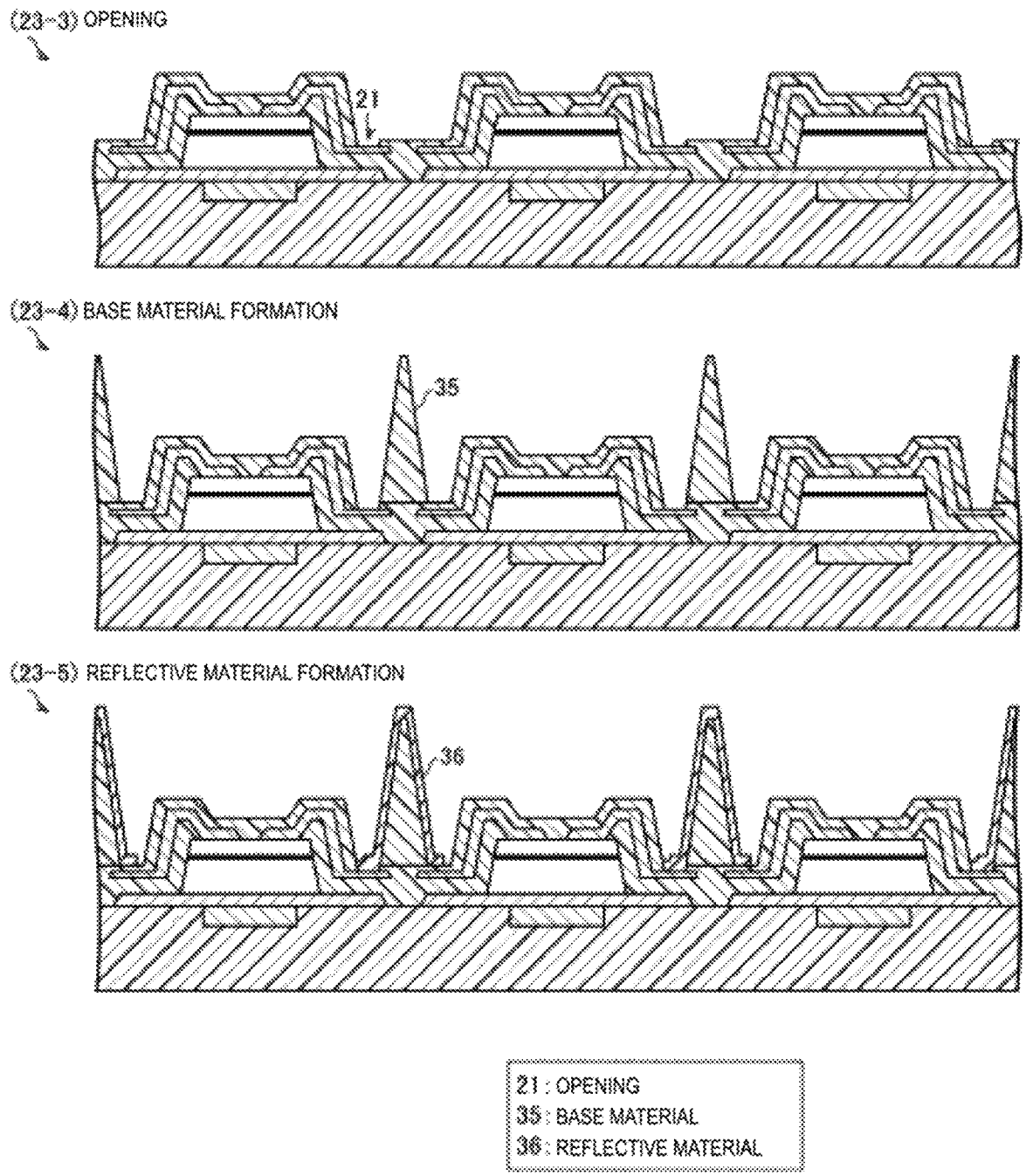

FIG. 23B is a cross-sectional schematic view illustrating a manufacturing process of the image display element.

Figure 23C:
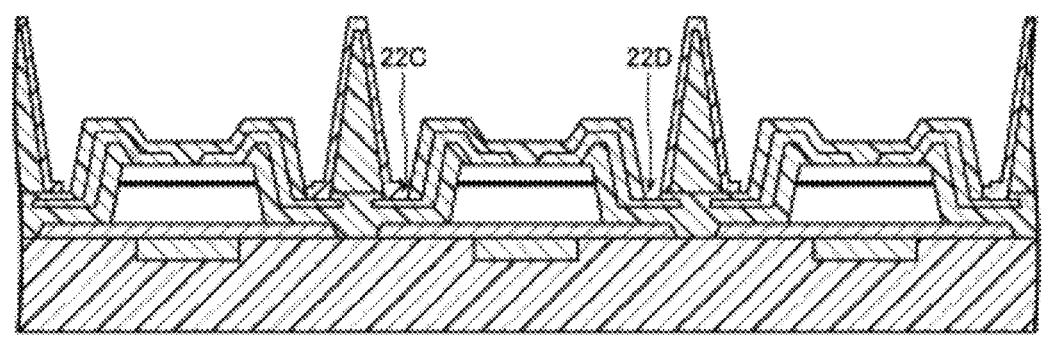
Figure 23C:
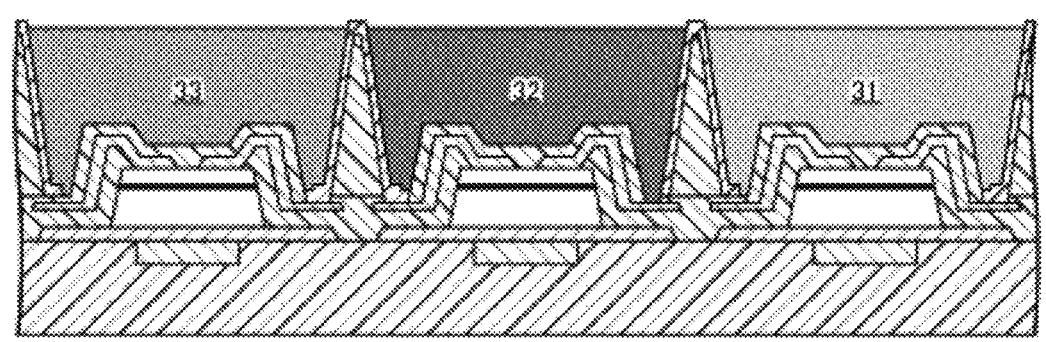

FIG. 23C is a cross-sectional schematic view illustrating a manufacturing process of the image display element.

DETAILED DESCRIPTION OF THE INVENTION

Hereinafter, an image display element 200 including a plurality of micro light emitting elements 100 is used as an example, and embodiments of the disclosure will be described with reference to FIGS. 1 to 23C. Note that the image display element 200 includes a plurality of micro light emitting elements 100 and a driving circuit substrate 50, and the driving circuit substrate 50 supplies current to the micro light emitting elements 100 in a pixel area 1, and controls light emission. The micro light emitting elements 100 are disposed in an array in the pixel area 1. The micro light emitting elements 100 emit light in a direction opposite to the driving circuit substrate 50. Unless otherwise indicated, the surface on which the micro light emitting elements 100 emit light into the air is referred to as a light emitting surface 130. Note that, in the description of the configuration of the image display element 200, unless otherwise indicated, the light emitting surface 130 is referred to as an upper surface (first surface), a surface on the side opposite to the light emitting surface is referred to as a lower surface (second surface), and side surfaces other than the upper surface and the lower surface are referred to as side surfaces. The direction toward the air in a direction perpendicular to the light emitting surface 130 is referred to as the front. The surface of the driving circuit substrate 50 is a bonding surface where the plurality of micro light emitting elements 100 are bonded thereto, and the plurality of micro light emitting elements 100 are bonded thereto. Unless otherwise indicated, the bonding surface is a horizontal plane.

The driving circuit substrate 50 includes a micro light emitting element driving circuit that controls the current supplied to each of the micro light emitting elements 100 disposed in the pixel area 1; and includes a row selection circuit for selecting each row of the micro light emitting elements 100 disposed in a two-dimensional matrix, a column signal output circuit for outputting a light emission signal to each column, an image processing circuit configured to calculate a light emission signal on the basis of the input signal, an input/output circuit, and the like disposed outside the pixel area 1. An N-drive electrode 51 (first drive electrode) and a P-drive electrode 52 (second drive electrode) that connect to the micro light emitting element 100 are disposed on the surface of the driving circuit substrate 50 located closer to the bonding surface. The driving circuit substrate 50 is typically a silicon substrate (semiconductor substrate) on which an LSI is formed, or a glass substrate or a plastic substrate on which a TFT is formed, and can be manufactured by known techniques. Accordingly, the function and configuration thereof will not be described in detail.

In the present specification, only a structure in which an N electrode 23N and a P electrode 23P of the micro light emitting element 100 directly connect to the N-drive electrode 51 and the P-drive electrode 52, respectively, is illustrated; however, a member for connection, such as bumps, pastes, or nanoparticles, may be interposed between the them.

In the following, a description will be given of a case where the excitation light emitting element constituting the micro light emitting element 100 mainly includes a nitride semiconductor; however, the material constituting the light emission layer of the excitation light emitting element is not limited to a nitride semiconductor, and may be other compound semiconductor materials such as perovskite materials or quantum dot materials. A configuration in which the N-side layer 11 is disposed closer to the driving circuit substrate is described for the nitride semiconductor layer 14; however, a configuration in which the P-side layer 13 is disposed closer to the driving circuit substrate is also possible. Although each of the N-side layer 11, the light emission layer 12, and the P-side layer 13 is typically optimized with a plurality of layers, rather than a single layer; however, this is not directly related to one aspect of the disclosure, and thus the detailed structures of the N-side layer 11, the light emission layer 12, and the P-side layer 13 will not be described in detail. Typically, the light emission layer 12 is sandwiched between the N-type layer and the P-type layer; however, the N-type layer and the P-type layer may include a nondoped layer or a layer with dopants that are opposite in conductivity. Thus, in the following, the N-type layer and the P-type layer are described as the N-side layer and the P-side layer, respectively.

Note that in the drawings, the micro light emitting element 100 is depicted in a shape close to a square; however, the shape of the micro light emitting element 100 is not particularly limited thereto. The micro light emitting element may take a variety of planar shapes, such as triangular, rectangular, polygonal, circular, or oval, and is assumed to have the largest length of no more than 60 μm. The image display element 200 is assumed to have three thousand or greater micro light emitting elements integrated in the pixel area 1.

First Embodiment

Configuration of Image Display Element 200

Figure 1:
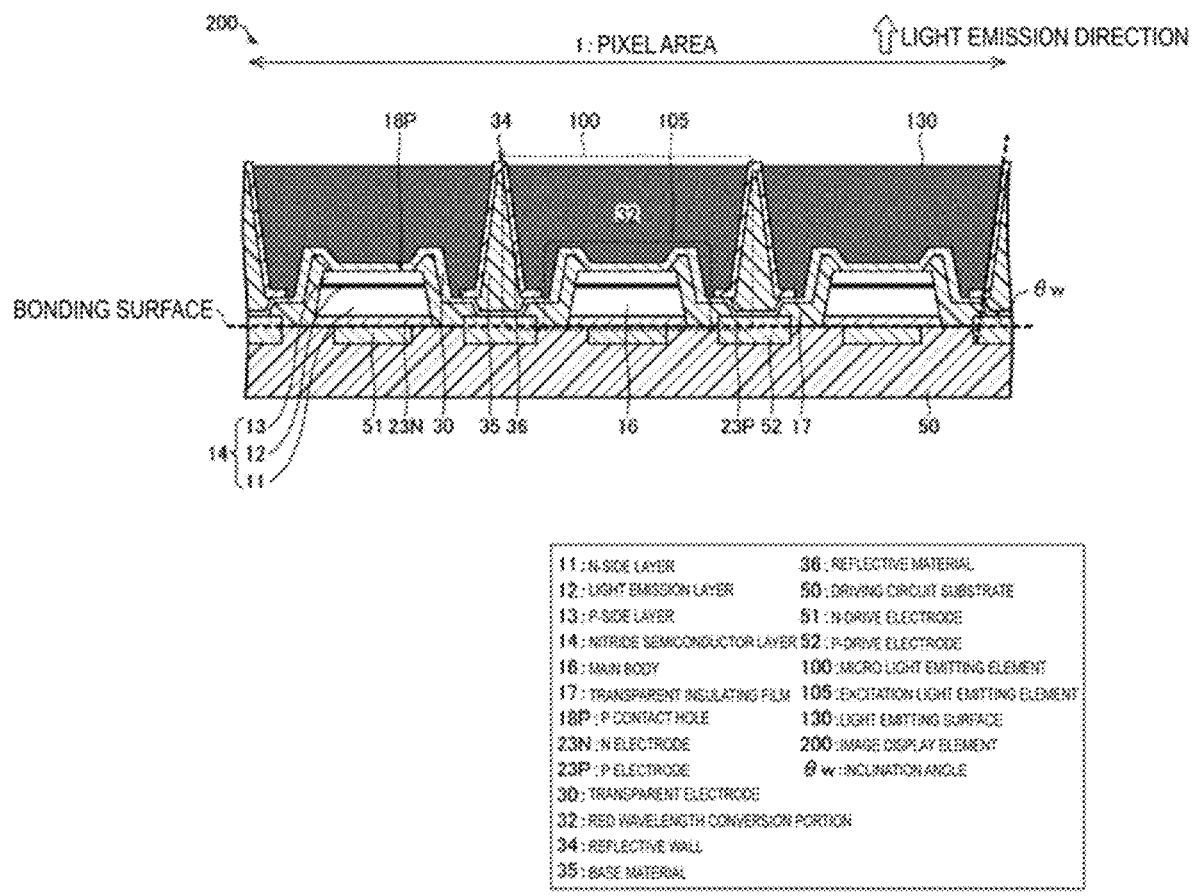
FIG. 1 is a cross-sectional schematic view of an image display element according to a first embodiment of the disclosure.
Figure 2:
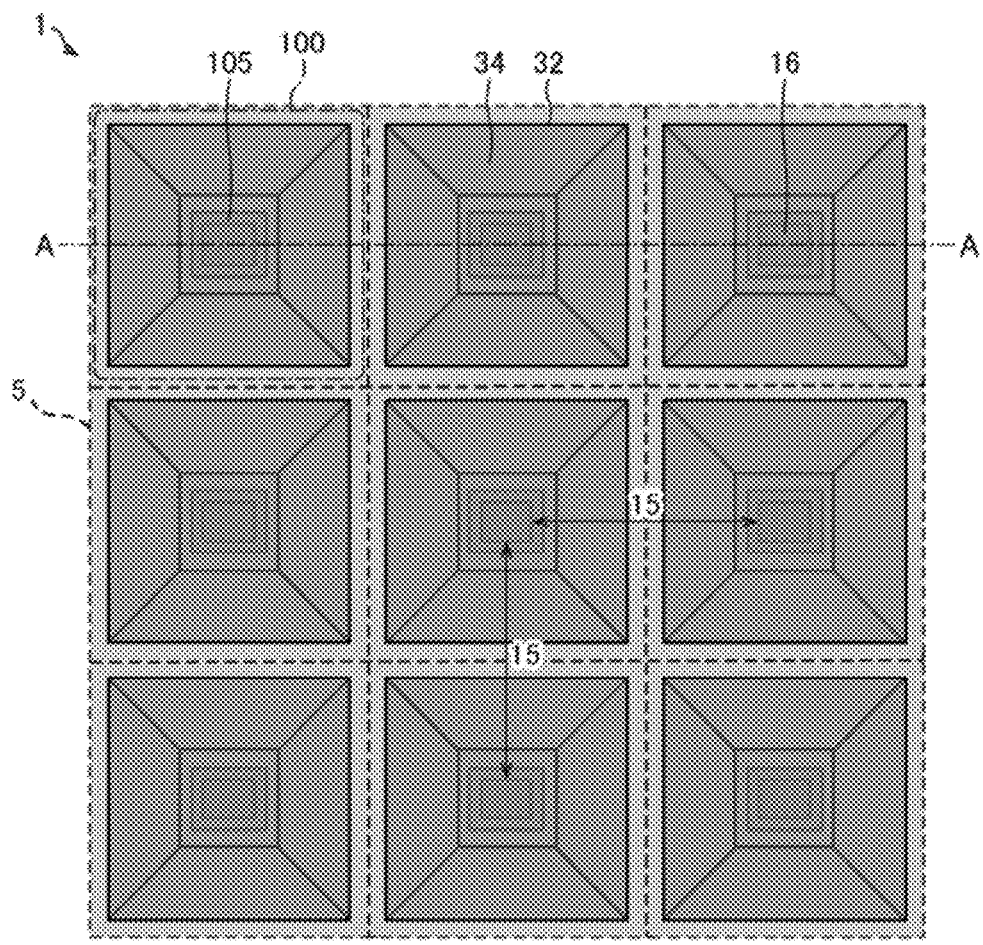
FIG. 2 is a schematic plan view of the image display element according to the first embodiment of the disclosure.

FIG. 1 is a cross-sectional schematic view of a pixel area 1 of an image display element 200 according to a first embodiment of the disclosure. FIG. 2 is a schematic plan view of the pixel area 1 of the image display element 200 according to the first embodiment of the disclosure. FIG. 1 illustrates a cross-sectional view at the portion of the A-A line of FIG. 2. As illustrated in FIG. 2, an upper surface of the image display element 200 is a pixel area 1 in which a plurality of pixels 5 are disposed in an array. In the present embodiment, the image display element 200 is a single color display element, and each of the pixels 5 includes a single color micro light emitting element 100. As illustrated in FIG. 2, in the pixel area 1, the pixels 5 are disposed in an array, each pixel 5 emits red light, and a red single color image is displayed by adjusting the intensity of each of the pixels 5.

The micro light emitting element 100 includes an excitation light emitting element 105 that emits blue light, a red wavelength conversion portion 32, and a reflective wall 34. The excitation light emitting element 105 includes a main body 16 formed by dividing a nitride semiconductor layer 14, an N electrode 23N (first electrode), and a transparent electrode 30 (second electrode). The transparent electrode 30 is disposed closer to the light emission surface and the N electrode 23N is disposed closer to the driving circuit substrate 50. The N electrode 23N is connected to the N-drive electrode 51 on the driving circuit substrate 50. The transparent electrode 30 is connected to the P electrode 23P disposed between the pixels, and the P electrode 23P is connected to the P-drive electrode 52 on the driving circuit substrate 50. The amount of light emission of the excitation light emitting element 105 is controlled in accordance with the amount of current flowing between the N-drive electrode 51 and the P-drive electrode 52 of the driving circuit substrate 50.

In the nitride semiconductor layer 14 constituting the main body 16, an N-side layer 11, a light emission layer 12, and a P-side layer 13 are layered in this order with the N-side layer 11 located closest to the driving circuit substrate 50. The light emission layer 12 is preferably disposed on the upper surface side of the nitride semiconductor layer 14. The bottom surface of the main body 16 is preferably covered by the N electrode 23N. In a case where there is a portion not covered by the N electrode 23N, light leaks from the main body 16 toward the driving circuit substrate 50, resulting in a reduction in light emission efficiency and optical crosstalk. A material having a high reflectivity is preferably disposed on the N-side layer 11 side of the N electrode 23N, such as aluminum or silver. Aluminum or silver is easy to form an ohmic contact with the N-type layer, and is suitable for an electrode connected to the N-side layer 11. For metal materials with low reflectivity, such as titanium or palladium, light absorption at the bottom surface increases, and light emission efficiency decreases.

An opening (P contact hole 18P) formed by removing a transparent insulating film 17 is present on the upper surface of the main body 16, and the P-side layer 13 and the transparent electrode 30 are connected in the P contact hole 18P. The transparent electrode 30 may be an oxide semiconductor such as Indium-Tin-Oxide (ITO) or Indium-Zinc-Oxide (IZO), or may be a silver nanofiber film or the like. A transparent electrode material such as ITO can easily form an ohmic contact with the P-type layer. To reduce absorption of excitation light, the transparent electrode 30 is preferably as thin as possible. In a case where the transparent electrode 30 is thin, wiring resistance may increase; however, in the present configuration, wiring resistance can be kept low because the transparent electrode 30 is electrically connected to the P-drive electrode 52 with the P electrode 23P disposed at an end of the pixel 5 therebetween. Therefore, in a case where the P-side layer 13 is disposed on the upper side of the main body 16 and the N-side layer 11 is disposed on the lower side, the transparent electrode 30 is disposed on the light emitting side of the main body 16, and the metal electrode is disposed on the driving circuit substrate 50 side of the main body 16, thereby preventing light leakage. As a result, the light emission efficiency of the excitation light emitting element 105 can be increased while keeping the operating voltage low.

The entire side surface of the main body 16 is covered by the transparent insulating film 17. In a case where a portion of the side surface is covered with a metal material or a light-absorbing resin material, light extraction from the main body 16 to the red wavelength conversion portion 32 is inhibited, and the light emission efficiency is reduced. Preferably, the side surface of the main body 16 is nearly perpendicular to the horizontal plane. By making nearly perpendicular, the area of the light emission layer 12 can be made as large as possible, and resistance to processing damage can be improved.

The reflective wall 34 is disposed at the boundary between adjacent pixels 5, and in the present configuration, a reflective material 36 is disposed on the surface of a base material 35 having inclined side surfaces. The base material 35 is, for example, a resin material in which a resist pattern formed by a photolithography technique is hard baked. The reflective material 36 is a thin film of aluminum or silver having a high reflectivity. The surface of the reflective material 36 is inclined so as to open toward the light emission direction. The angle between the surface of the reflective material 36 and the horizontal plane is defined as θw. The smaller the θw, the more preferred.

As illustrated in FIG. 1, the excitation light emitting element 105 is surrounded by the reflective wall 34, the height of the reflective wall 34 is higher than that of the excitation light emitting element 105, and the excitation light emitting element 105 is entirely covered by the red wavelength conversion portion 32 except for the bottom surface. The upper surface of the red wavelength conversion portion 32 is the light emitting surface 130. In order for the red wavelength conversion portion 32 to efficiently absorb excitation light emitted by the excitation light emitting element 105, the red wavelength conversion portion 32 on the upper portion of the excitation light emitting element 105 is preferably thick. To ensure the thickness of the red wavelength conversion portion 32 on the excitation light emitting element 105 with respect to the reflective wall 34 having a certain height, the height of the excitation light emitting element 105 needs be reduced. That is, the height of the main body 16 needs to be reduced. For example, in a case where the arrangement pitch of the pixels 5 is 4 μm and the height of the reflective wall 34 is 4 μm, the height of the main body 16 is approximately 2 μm or less in a case of attempting to ensure a thickness of 2 μm of the red wavelength conversion portion 32 on the excitation light emitting element 105. In a case where more fine pixels are to be formed, the height of the main body 16 is preferably 2 μm or less. Generally, the height of the main body 16 is preferably less than or equal to ½ of the arrangement pitch of the pixels 5.

Furthermore, the red wavelength conversion portion 32 needs to cover the periphery of the excitation light emitting element 105. In other words, in a case where the space between the excitation light emitting element 105 and the reflective wall 34 is filled by the red wavelength conversion portion 32, excitation light can be efficiently absorbed by the red wavelength conversion portion 32.

Manufacturing Process of Image Display Element 200

Next, a manufacturing process of the image display element 200 will be described using (3-0) to (3-15) of FIGS. 3A to 3D. (3-0) to (3-15) of FIGS. 3A to 3D are cross-sectional schematic views illustrating a manufacturing process of the image display element 200 according to the first embodiment of the disclosure.

Figure 3A:
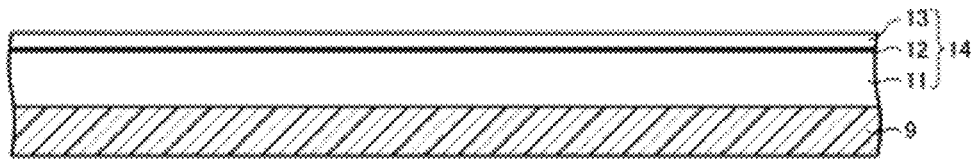
FIG. 3A is a cross-sectional schematic view illustrating a manufacturing process (manufacturing flow) of a micro light emitting element according to the first embodiment of the disclosure.
Figure 3A:
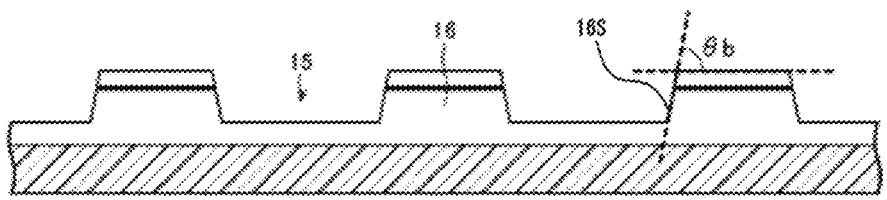
Figure 3A:
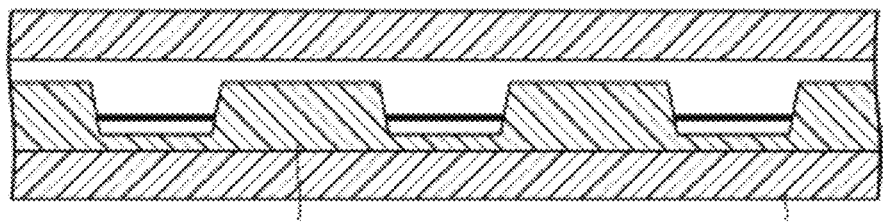
Figure 3A:
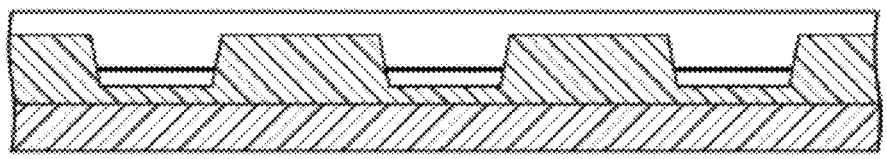
Figure 3A:

As illustrated in (3-0) of FIG. 3A, a nitride semiconductor layer 14 is formed by sequentially layering an N-side layer 11, a light emission layer 12, and a P-side layer 13 on a growth substrate 9. The growth substrate 9 is, for example, a sapphire substrate, an SiC substrate, a silicon substrate, or the like. The N-side layer 11 is preferably disposed closer to the growth substrate 9. This is because in a case where the P-side layer 13 is grown first, the magnesium (Mg) serving as a dopant remains in the growth chamber of the MOCVD apparatus, and the magnesium also enters the light emission layer 12, resulting in a problem of reduced light emission efficiency.

As illustrated in (3-1) of FIG. 3A, a portion of the P-side layer 13, the light emission layer 12, and the N-side layer 11 is removed by using a photolithography method and a dry etching method to form a separation trench 15. At this time, the portion including the light emission layer 12 becomes the main body 16. The main body 16 is constituted by the N-side layer 11, the light emission layer 12, and the P-side layer 13. As illustrated in FIG. 2, the separation trench 15 is formed at equal intervals in the vertical direction and the right-left direction in a plan view, and the shape of the main body 16 is a square prism or a square frustum having side surfaces with a large inclination angle. However, the planar shape of the main body 16 is not limited to a square shape, and may be a triangle, a circle, an ellipse, or other polygonal shape. The inclination angle θb of the side surface 16S of the main body 16 with respect to the horizontal plane is preferably close to 90 degrees and is preferably at least 80 degrees or greater. In a case where the inclination angle θb is kept close to 90 degrees, the area of the light emission layer 12 is held large, and the effects of damage caused in a case where the separation trench 15 is formed can be reduced. The inclination angle θb may be 100 degrees or less. That is, even in a case where the sidewall of the main body 16 is slightly reverse-tapered in (3-1) of FIG. 3A, the reduction in the light extraction efficiency is small and acceptable.

The depth of the separation trench 15 is preferably shallow as long as the concentration of N-type impurities (normally silicon) in the N-side layer 11 is sufficiently high. In a case where the depth is shallow, the amount of dry etching can be reduced and damage can be reduced. Since the depth of the separation trench 15 roughly corresponds to the height of the main body 16, making the height of the main body 16 lowered is making the depth of the separation trench 15 shallower. Therefore, by lowering the height of the main body 16, the excitation light emitting element 105 is covered by the red wavelength conversion portion 32 having a sufficient thickness, and the light emission efficiency is increased by reducing damage.

After the separation trench 15 is formed, recovery treatment of damage generated during the formation of the separation trench 15 is performed. Damage is considered to be electronic defects such as lattice defects or dangling bonds generated by ions having high energy incident on the nitride semiconductor layer 14 from the plasma used during dry etching, resulting in non-emissive recombination. The damage recovery treatment is, for example, a treatment for removing damaged portions by strong alkali liquid. Alternatively, the damage recovery treatment includes high temperature annealing (for example, 500° C. or higher) in various gas atmospheres or regrowth of the nitride semiconductor layer. In this step, the nitride semiconductor layer 14 is located on the growth substrate 9, and a metal material or an organic material is not attached thereon, and thus various damage recovery methods can be applied.

On the other hand, in a manufacturing method in which the nitride semiconductor layer 14 is dry etched after the nitride semiconductor layer 14 is bonded to the driving circuit substrate 50, the electrode layer used during bonding is exposed, and this makes it difficult to perform an acid or alkali treatment. The temperature of the high temperature treatment is also limited because the driving circuit substrate 50 does not withstand high temperature treatment, such as growth of the nitride semiconductor layer 14 (constrained to 450° C. or lower). This step has the advantage of reducing the damage by making the depth of the separation trench 15 shallow and of thoroughly increasing the degree of damage recovery by applying various damage recovery methods.

After forming the separation trench 15, the nitride semiconductor layer 14 is bonded to a transfer substrate 10 via an adhesive material (adhesive/adhesive layer) 4, as illustrated in (3-2) of FIG. 3A, and the growth substrate 9 is peeled away as illustrated in (3-3) of FIG. 3A. In a case where the growth substrate 9 is transparent like sapphire or SiC, a laser lift-off method can be used. In a case where the growth substrate 9 is not transparent like silicon, a method such as grinding, polishing, wet etching, or plasma etching can be combined to peel off the substrate. The transfer substrate is preferably made of the same material as that of the driving circuit substrate 50 and is preferably a substrate that is flat to the same extent as the driving circuit substrate 50. Examples of the transfer substrate include a silicon substrate and a glass substrate.

Next, as illustrated in (3-4) of FIG. 3A, the N-side layer 11 exposed by the substrate peeling is polished, and a portion of the N-side layer 11 at a position of the separation trench 15 is completely removed. In this way, the main body 16 is divided into individual pieces for each pixel 5. In the present manufacturing method, most of the N-side layer 11 can be removed by using a polishing method that does not cause damage to the light emission layer 12. As a result, the occurrence of damage that leads to a decrease in light emission efficiency can be suppressed. In the present step, at a time at which the portion of the N-side layer 11 at a position of the separation trench 15 is removed, the adhesive material with a largely different polishing characteristic appears. This makes it easy to detect the end point of polishing and allows the thickness of the main body 16 to be controlled with high precision. Note that, in a case where a polishing blocking material (for example, an SiN film or the like) is disposed at the bottom portion of the separation trench 15 after (3-1) of FIG. 3A, the further increased thickness control of the main body 16 is possible.

The use of the transfer substrate 10 is important when manufacturing the main body 16 with a low height. As described above, in the present configuration, the height of the main body 16 needs to be reduced; however, in general, the driving circuit substrate 50 exhibits at least a few μm or more processing variations in the thickness, and in a case where the nitride semiconductor layer 14 is polished after being bonded to the driving circuit substrate 50, it is difficult to control the height variation of the main body 16. Variations in the thickness of the driving circuit substrate 50 can be reduced; however, the manufacturing cost increases and it is actually difficult. On the other hand, since the transfer substrate 10 can be reused, even in a case where the cost is high, a product with low thickness variation can be used. Accordingly, in a method in which the nitride semiconductor layer is bonded to the transfer substrate 10, the growth substrate 9 is peeled off from them, and the main body 16 is separated from each other by polishing, the height variation of the main body 16 can be reduced, and the main body 16 having a lower height can be manufactured.

Figure 3B:
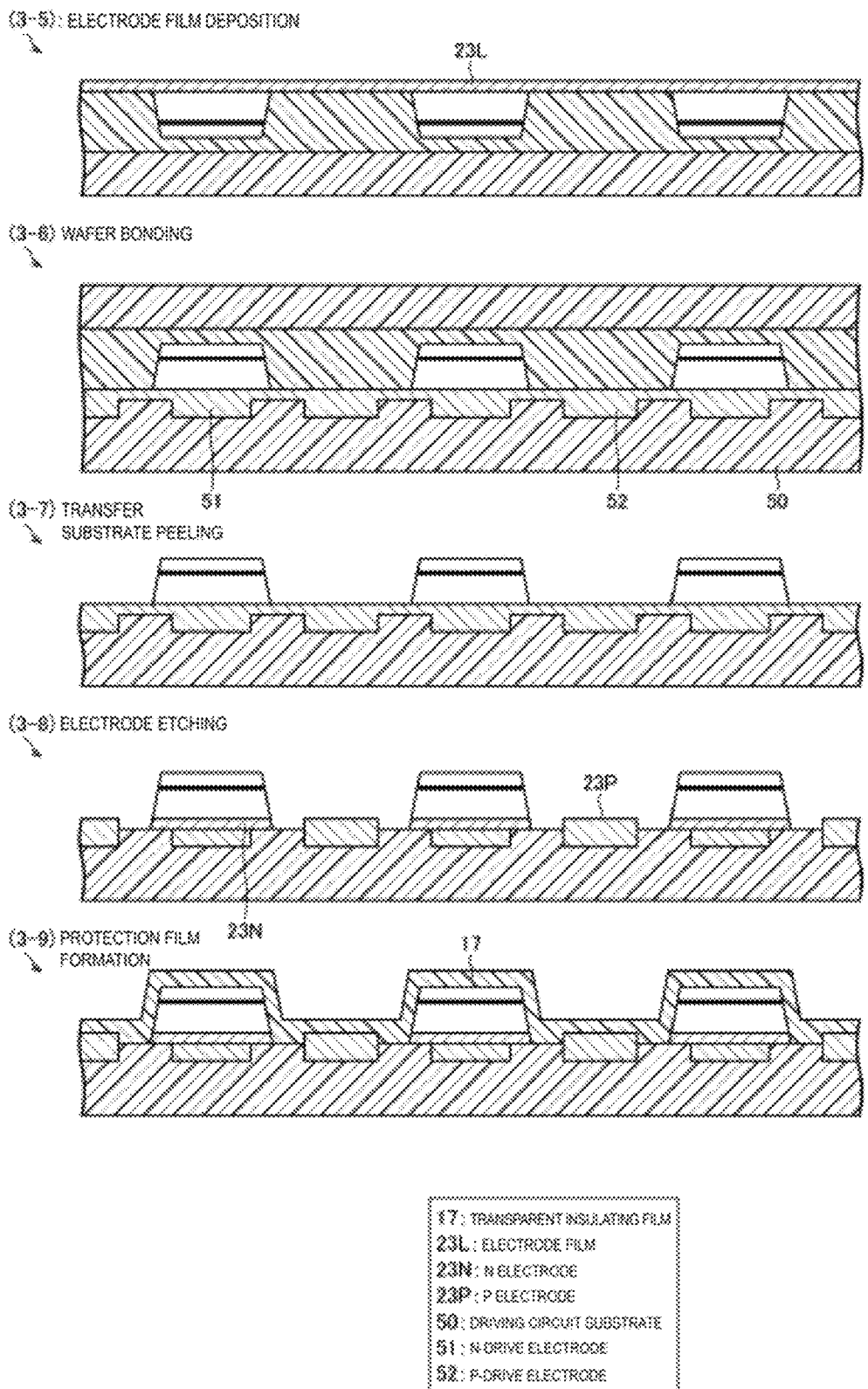
FIG. 3B is a cross-sectional schematic view illustrating a manufacturing process of the micro light emitting element.

Next, an electrode film 23L is then deposited as illustrated in (3-5) of FIG. 3B. The electrode film 23L comes into direct contact with the main body 16, forms an ohmic contact with the N-side layer 11, and preferably has a high reflectivity for excitation light or light (red light in the present embodiment) obtained by converting the wavelength of excitation light. Examples of materials that satisfy such conditions include silver and aluminum. The electrode film 23L is not limited to a single layer film made of silver or aluminum, and may be a multilayer film in which these materials are disposed on a surface in contact with the main body 16.

Next, as illustrated in (3-6) of FIG. 3B, the electrode film 23L is bonded to a separately manufactured driving circuit substrate 50 so as to face the surface of the driving circuit substrate 50. Upon bonding, the main body 16 is precisely aligned such that the main body 16 is positioned on the N-drive electrode 51. In the following, each of the transfer substrate 10 and the driving circuit substrate 50 is described as being in a wafer state; however, the transfer substrate 10 may be singulated in units of the image display elements 200, and the driving circuit substrate 50 may be in a wafer state, or both the transfer substrate 10 and the driving circuit substrate 50 may be singulated in units of the image display elements 200. For the driving circuit substrate 50, only the N-drive electrode 51 and the P-drive electrode 52 are illustrated, and other structures are omitted. Note that since the main body 16 needs to be precisely aligned with the N-drive electrode 51, the electrode film 23L may be removed in advance in a region other than the pixel area 1.

In a bonding step, the two wafers are bonded together by plasma cleaning the surface, activation by ion irradiation, heating, and pressurizing, which is performed depending on the material of the bonding surface of the electrode film 23L and the driving circuit substrate 50. To facilitate bonding, the material of the electrode film 23L at the bonding surface and the materials of the bonding surface of the N-drive electrode 51 and the P-drive electrode 52 at the bonding surface are preferably the same.

Next, as illustrated in (3-7) of FIG. 3B, the adhesive material 4 is dissolved and the transfer substrate 10 is removed. Next, as illustrated in (3-8) of FIG. 3B, a photolithography technique and a dry etching technique are used to etch the electrode film 23L of the periphery of the main body 16. As a result, the N electrode 23N disposed on the bottom surface of the main body 16 and the P electrode 23P disposed between the pixels 5 are separated. The N electrode 23N may protrude outward from the main body 16. The P electrodes 23P may be connected to each other in the horizontal plane in the vertical direction or the P electrode 23P may be segmented into individual P electrodes 23P. The P electrode 23P need not be disposed at all of the pixel boundaries, and may be disposed for each set of pixel boundaries. The region where the N electrode 23N and the P electrode 23P are etched away is preferably as narrow as possible because the region is a path that light is incident on the driving circuit substrate 50. In the driving circuit substrate 50, a wiring line layer, which is different from the wiring line layer constituting the N-drive electrode 51 and the P-drive electrode 52, in a lower layer may be disposed on the lower side of the region to shield light.

Next, as illustrated in (3-9) of FIG. 3B, a transparent insulating film 17 is deposited as a protection film. The transparent insulating film 17 covers all surfaces except the bottom portion of the main body 16, and covers the N electrode 23N, the P electrode 23P, and the gap between both electrodes. As illustrated in (3-10) of FIG. 3C, a photolithography technique and a dry etching technique are used to open a P contact hole 18P on the upper portion of the main body 16 and an electrode contact hole 18M on the P electrode 23P. Further, as illustrated in (3-11) of FIG. 3C, a transparent electrode 30 is deposited. The transparent electrode 30 is in contact with the P-side layer 13 in the P contact hole 18P, in contact with the P electrode 23P in the electrode contact hole 18M and covers the side surface of the main body 16 to electrically connect the P-side layer 13 and the P electrode 23P.

Except for the bottom surface, the main body 16 is covered by the transparent insulating film 17 and the transparent electrode 30, and the excitation light is emitted from the main body to the outside. Since the transparent electrode 30 slightly absorb the excitation light, the transparent electrode 30 is preferably formed as thin as possible as long as the electrical resistance of a portion between the P-side layer 13 and the P electrode 23P is not large, and the thickness thereof is preferably from 10 nm to 300 nm. Although not illustrated, a photolithography technique and an etching technique are used to preferably remove the transparent electrode 30 disposed in an area other than the pixel area 1. At this time, a portion of the transparent electrode 30 that covers the outer periphery of the main body 16 may be removed. In a case where the area of the transparent electrode 30 that covers the periphery of the main body 16 can be reduced, absorption loss caused by the transparent electrode 30 absorbing excitation light can be reduced.

Figure 3C:
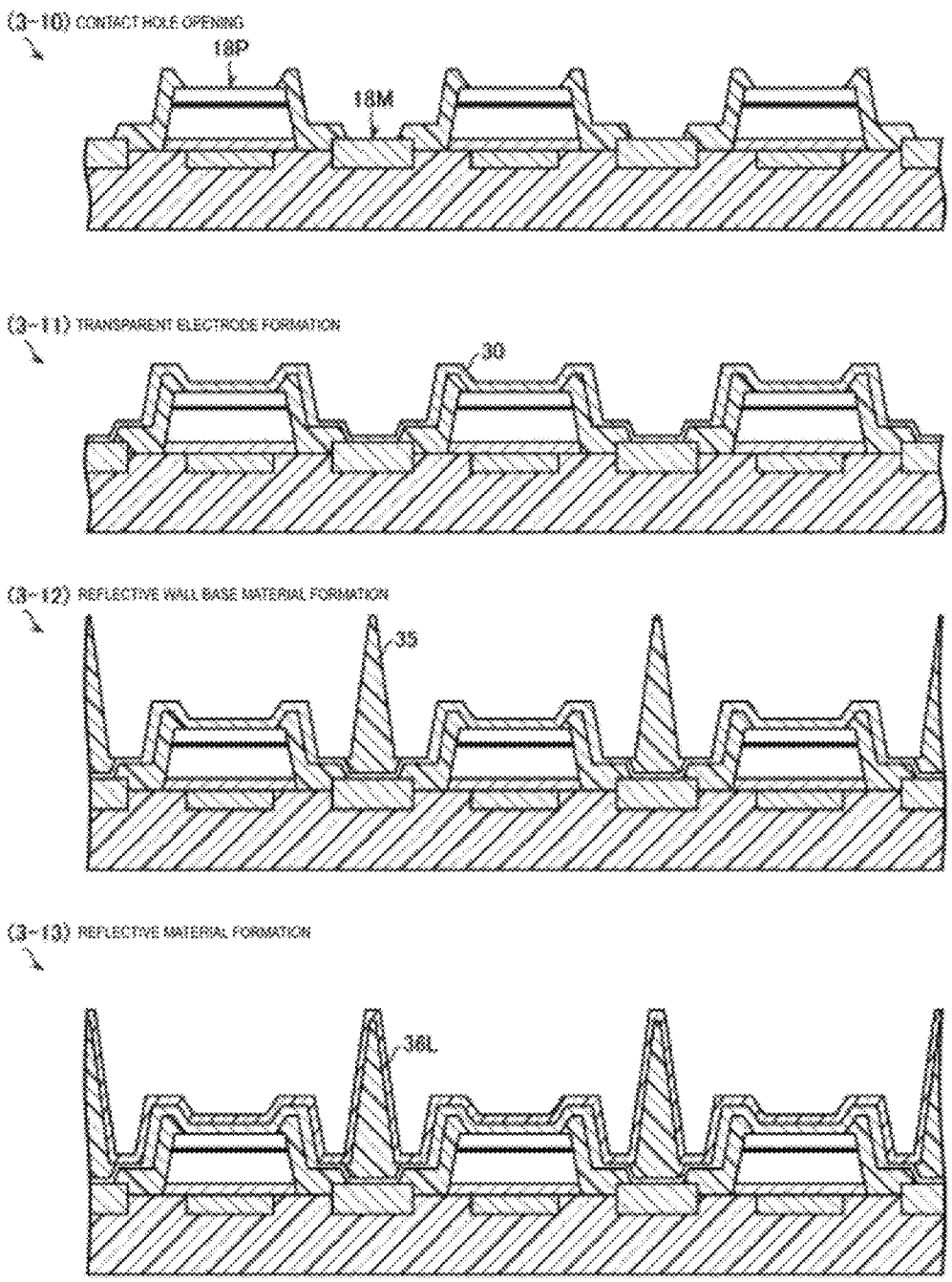
FIG. 3C is a cross-sectional schematic view illustrating a manufacturing process of the micro light emitting element.

Next, as illustrated in (3-12) of FIG. 3C, a base material 35 that is a wall is formed at the boundary between the pixels 5 so as to surround the periphery of the main body 16. A method for using a resist pattern formed by a photolithography technique as it is, is most convenient as a method for forming the base material 35. The base material 35 allows the pixel 5 to have a bus tab-like shape and the excitation light emitting element 105 is disposed on the bottom of the bus tab. Furthermore, as illustrated in (3-13) of FIG. 3C, a reflective material film 36L is deposited on the entire surface. The reflective material film 36L is a thin film made from a metal having high reflectivity such as silver or aluminum.

Figure 3D:
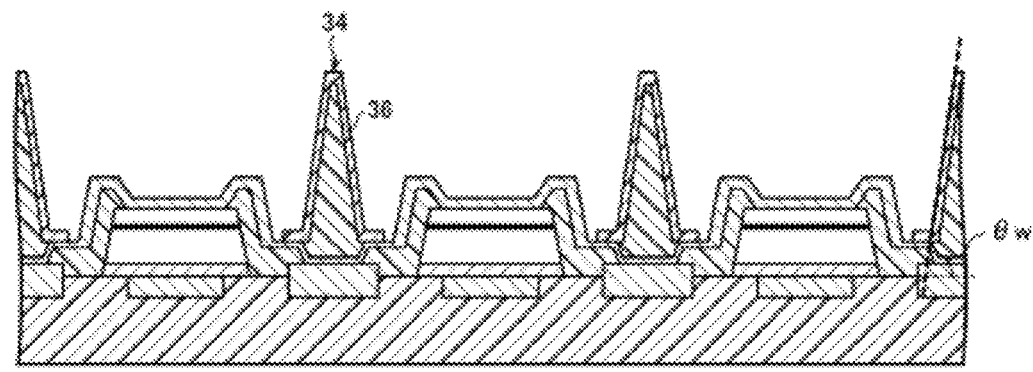
FIG. 3D is a cross-sectional schematic view illustrating a manufacturing process of the micro light emitting element.
Figure 3D:
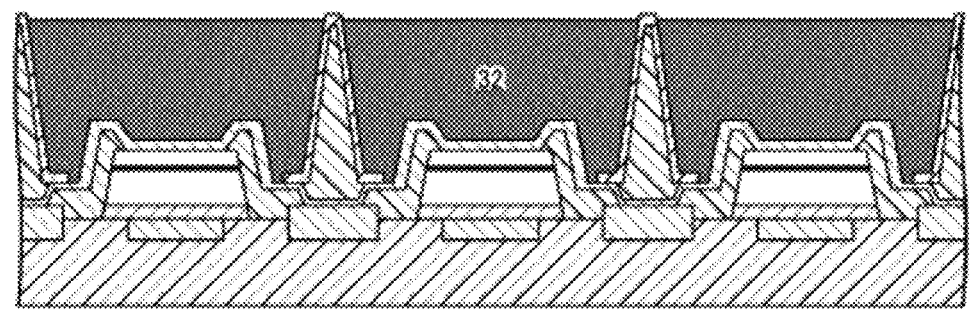

Next, as illustrated in (3-14) of FIG. 3D, a photolithography technique and dry etching technique or wet etching technique are used to remove the reflective material film 36L covering the upper surface and the side surface of the main body 16. As a result, the reflective material 36 covering the surface of the base material 35 is formed. The base material 35 and the reflective material 36 constitute a reflective wall 34. The reflective material 36 preferably covers the surface of the driving circuit substrate 50 as much as possible such that the reflective material 36 does not cover the upper surface and the side surface of the main body 16. Light leakage to the driving circuit substrate 50 can be reduced. The inclination angle θw of the sidewall 34S of the reflective wall 34 can be controlled to various values primarily by controlling the inclination angle of the sidewall of the base material 35.

Furthermore, as illustrated in (3-15) of FIG. 3D, a red wavelength conversion portion 32 is formed in the bus tab-like space formed by the reflective wall 34. The red wavelength conversion portion 32 may be formed such that a positive resist or a negative resist material is prepared as a material thereof, and the resist is patterned by a photolithography technique, or is patterned by a printing technique such as ink jet printing or screen printing. A phosphor or nanoparticles such as quantum dots or a quantum rod for absorbing blue light, which is excitation light, and down-converting the blue light into red light can be applied to the red wavelength conversion portion 32.

After the steps described above are performed, the image display element 200 is completed via a test step, a dicing step, a mounting step, and the like.

Light Emission Efficiency of Micro Light Emitting Element 100

The light emission efficiency of the micro light emitting element 100 formed as described above was evaluated. For the micro light emitting element 100, the arrangement pitch is 4 µm, the main body 16 is square, the length of one side is 1.0 µm, the inclination angle θb of the sidewall is 89°, the thickness of the P-side layer 13 is 100 nm, and the thickness of the N-side layer 11 is 1.0 µm. The height of the reflective wall 34 is 3.2 µm. The N-side layer 11 is mainly a GaN layer, the light emission layer 12 is a multiple quantum well layer including InGaN and GaN, and the peak wavelength of light emitted from the light emission layer 12 is 450 nm. A material in which quantum dots that emit red light are dispersed in a negative resist was used as the red wavelength conversion portion 32.

Three types of samples were produced in which an inclination angle θw of the sidewall 34S of the reflective wall 34 were 85 degrees, 80 degrees, and 70 degrees, and total luminous flux measurements were performed, and the external quantum efficiency of the red light emission was calculated. The results are shown in Table 1. The external quantum efficiency of the excitation light measured in a state before formation of the red wavelength conversion portion 32 is also indicated for reference.

TABLE 1

| θw | 70 degrees | 80 degrees | 85 degrees |
|---|---|---|---|
| ηre (External quantum efficiency of red light) | 12.8% | 8.8% | 6.6% |
| ηee (External quantum efficiency of excitation light) | 14.4% | 14.6% | 13.6% |

As is apparent from Table 1, the external quantum efficiency of the excitation light is almost unchanged depending on θw; however, the smaller the θw is, the higher the red light external quantum efficiency is. Since the difference between the three samples is only the shape of the reflective wall 34, there is no significant difference in the characteristics of the excitation light emitting element 105, and it is considered that the difference in the conversion efficiency of the red wavelength conversion portion 32 causes the difference in Table 1.

Therefore, for the structures described above, the absorption amount of excitation light by the red wavelength conversion portion 32 and the light extraction efficiency of the red light were simulated. A ray tracking method was used in the simulation. The simulation results of the absorption amount of excitation light and the light extraction efficiency of red light are shown in (4-1) and (4-2) of FIG. 4, respectively. (4-1) of FIG. 4 also shows a simulation value (Direct emission) of the excitation light extraction efficiency in a case where the red wavelength conversion portion 32 is absent and the excitation light is directly emitted. The θw dependency of the absorption amount of the excitation light (Blue absorption) is very small, and the absorption amount decreases as the θw decreases. The θw dependency of the light extraction efficiency of the excitation light is also small, and it does not contradict the results in Table 1. The light extraction efficiency of red light becomes larger as the θw decreases. Most of the red light generated by the red wavelength conversion portion 32 is totally reflected by the light emitting surface; however, the angle incident on the light emitting surface changes every time the light is reflected by the reflective wall 34, so that the red light is emitted to the outside from the light emitting surface after repeatedly reflected several times. The incident angle on the light emitting surface changes each time the red light is reflected by the reflective wall 34; however, the change amount of the angle is greater as the θw is smaller, so that the light extraction efficiency of the red light increases as the θw decreases. The leakage amount of excitation light (Blue leakage) increases as the θw is smaller due to the same reason. Note that there exists a few % of excitation light leakage; however, it is not problematic because the excitation light leakage can be reduced by disposing a band-pass filter such as a dielectric multilayer film or color filter on the light emitting surface side of the image display element 200.

In a case where the size of the main body 16 is fixed and the θw is made smaller, the reflective wall 34 overlaps the main body 16. In a case where the reflective material 36 covers the side surface and the upper surface of the main body 16, the excitation light absorption amount of the red wavelength conversion portion 32 decreases, which is not preferable. Since at the θw=60 degrees, such a situation occurs, the calculation is performed in a state in which the length of one side of the main body 16 is made short, i.e., 0.4 μm.

The simulation results of the light emission angle distribution of red light at different θw are shown in (4-3) of FIG. 4. The change due to θw is not large. The light emission angle is an angle formed by the direction of travel of the light with respect to the normal direction of the surface of the image display element 200, where 0 degrees is the normal direction and 90 degrees is the horizontal direction. Note that a numerical value obtained by multiplying the light emission intensity by sin (light emission angle) is shown in (4-3) of FIG. 4, unlike the light emission angle distribution having a peak at 0 degrees that is commonly used. Accordingly, the contribution of the amount of light emission at each light emission angle can be intuitively understood.

The emission angle distribution greatly differs in the wavelength converted light by the red wavelength conversion portion 32 and the excitation light emitted directly into the air. The simulation results are shown in (4-4) of FIG. 4 for the case of θw=65 degrees (other conditions are the same as the above conditions). A Lambertian distribution is also shown for comparison. The graphs are normalized with respect to the maximum value of each distribution. In a case where excitation light is emitted directly into the air (Air), the light is strongly distributed forward by the reflective effect of the reflective wall 34. On the other hand, in the case of red light that has been wavelength converted (Red QD), the distribution is close to the Lambertian distribution. Therefore, since the red light that has been wavelength converted is not strongly distributed in the forward direction, in a case of being utilized in AR glasses or the like, another means of enhancing the light distribution forward is required. As the light distribution control member, for example, a nano-antenna array, a combination of a micro lens and a micro mirror, or the like, disposed on the light emitting surface of the red wavelength conversion portion 32, can be used. This will be described in detail in the seventh and eighth embodiments.

Combining the experimental results of Table 1 and the simulation results described above, estimated the internal quantum efficiency of the excitation light emitting element 105 and the wavelength conversion internal quantum efficiency from the excitation light to the red light are shown in Table 2.

TABLE 2

| θw | 70 degrees | 80 degrees | 85 degrees |
|---|---|---|---|
| ηri (Internal quantum efficiency of red light downconverter) | 68% | 70% | 67% |
| ηei (Internal quantum efficiency of excitation light emitter) | 61% | 62% | 59% |
| LEEe (Excitation light extraction efficiency) | 23.7% | 23.6% | 23.0% |
| Abs (Excitation light absorption) | 81.3% | 84.3% | 85.5% |
| LEEr (Red light extraction efficiency) | 38.3% | 24.1% | 19.5% |

The calculation equation used are as follows:

$$\eta ei = \eta ee / LEEe$$

$$\eta ri = \eta re / (\eta ei * Abs * LEEr)$$

From this result, the internal quantum efficiency of the excitation light emitting element 105 achieves approximately 60%, which is less than an internal quantum efficiency of a normal large LED, which is approximately 80%; however, the excitation light emitting element 105 achieves a very high value as a micro LED in a micron size. The effect of processing the excitation light emitting element 105 on the growth substrate, and performing the sufficient damage recovery method in the manufacturing steps from FIGS. 3A to 3D is appearing.

In (4-1) of FIG. 4, the excitation light absorption amount and the leakage amount are shown in a case where the epitaxial structure is reversed in the case of θw=65 degrees. As illustrated in FIG. 1, in the present configuration, the N-side layer 11 is disposed closer to the driving circuit substrate 50, the P-side layer is disposed closer to the light emitting surface, and the light emission layer 12 is disposed on the upper portion of the main body 16. As a result, aluminum or silver having a high reflectivity can be disposed on the bottom surface of the main body 16 (These metal films can form ohmic contacts with an N-type GaN). Meanwhile, in a case where the epitaxial structure is reversed, the P-side layer is disposed closer to the driving circuit substrate 50, and the metal electrode needs to be brought into contact with the P-side layer 13. In this case, the light emission layer 12 is disposed closer to the drive circuit substrate 50 in the main body 16. To form ohmic contact with the P-side layer 13, palladium (Pd) or the like having a low reflectivity is used. As a result, as shown in (4-1), the excitation light absorption amount by the red wavelength conversion portion 32 decreases. This is because the reflectivity at the bottom portion of the main body 16 decreases, and the loss of excitation light becomes large. For red light as well, the light extraction efficiency decreases because absorption at the bottom portion of the main body 16 increases. Therefore, disposing the light emission layer 12 closer to the driving circuit substrate 50 is not preferable because this reduces the emission efficiency of red light. Even in a configuration in which the N-side layer 11 is disposed closer to the driving circuit substrate 50 in the main body 16, in a case where the P-side layer 13 is thick, the light emission efficiency of the red light decreases. In the simulation results, in a case where the light emission layer 12 is in the center portion of the main body 16 (the thickness of the P-side layer is 550 nm), the light emission efficiency is reduced by about 5% compared with the case of FIG. 4 (the thickness of the P-side layer is 100 nm). Therefore, at least the light emission layer 12 should be disposed in a region of the upper half of the main body 16.

As described above, a bus tab shape is formed by covering the periphery of the excitation light emitting element with the reflective wall, and the excitation light emitting element is covered by the wavelength conversion material except for the surface located closer to the driving circuit substrate by filling the inside of the bus tab with the wavelength conversion material. Furthermore, the light emission layer of the excitation light emitting element is disposed on the opposite side to the driving circuit substrate, and the reflective wall is inclined so as to open with respect to the light emission direction of the micro light emitting element, thereby increasing the external emission efficiency of the red light.

Second Embodiment

Configuration of Image Display Element 200a

Another embodiment of the disclosure will be described below with reference to FIGS. 5 and 6. Note that, for convenience of description, components having the same functions as those described in the embodiment described above will be denoted by the same reference signs, and descriptions of those components will be omitted. The image display element 200a of the second embodiment has a configuration similar to that of the first embodiment; however, differs in that the display element is a full color display element rather than a single color display element.

As illustrated in FIG. 5, the image display element 200a includes a plurality of blue micro light emitting elements 100B, a plurality of red micro light emitting elements 100R, a plurality of green micro light emitting elements 100G, and a driving circuit substrate 50. The driving circuit substrate 50 supplies current to the blue micro light emitting element 100B, the red micro light emitting element 100R, and the green micro light emitting element 100G in the pixel area 1, and controls the emission. Each of the blue micro light emitting element 100B, the red micro light emitting element 100R, and the green micro light emitting element 100G includes an excitation light emitting element 105 that emits blue light and a reflective wall 34, similar to the micro light emitting element 100 of the first embodiment. The red micro light emitting element 100R includes a red wavelength conversion portion 32 in the same manner as the micro light emitting element 100 of the first embodiment, the green micro light emitting element 100G includes a green wavelength conversion portion 33 instead of the red wavelength conversion portion 32, and the blue micro light emitting element 100B includes a transparent portion 31 instead of the red wavelength conversion portion 32.

As illustrated in FIG. 6, the pixels 5a are disposed in an array in the pixel area 1, and each of the pixels 5a includes a blue subpixel 6, a red subpixel 7, and a green subpixel 8. The subpixels emit blue light, red light, and green light, respectively, and the respective intensities are adjusted. This allows the pixel 5a to emit light of various colors. FIG. 5 illustrates a cross-sectional view at the portion of the B-B line of FIG. 6. The blue, red, and green subpixels 6, 7, and 8 include a blue micro light emitting element 100B, a red micro light emitting element 100R, and a green micro light emitting element 100G, respectively. Note that in FIG. 6, two green subpixels 8 are disposed; however, the type and number of subpixels constituting the pixel are not limited to this. In FIG. 6, the blue subpixel 6, the red subpixel 7, and the green subpixel 8 are drawn in a shape close to a square, but may be rectangular, circular, or elliptical.

In the present configuration, a blue micro light emitting element 100B including a transparent portion 31 is employed as the blue subpixel 6. The reason for this is that the light emission efficiency via the transparent portion 31 is greater than a case in which the light is emitted directly from the excitation light emitting element 105 into the air. The measurement results at θw=70 degrees, 80 degrees, and 85 degrees are shown in Table 3. The results are shown in comparison to the external quantum efficiency ηee of the excitation light measured before forming the transparent portion 31. (ηee is the same as Table 1)

TABLE 3

| Comparison of External Quantum Efficiency | | | |
|---|---|---|---|
| θw | 70 degrees | 80 degrees | 85 degrees |
| Blue light external quantum efficiency ηte (External quantum efficiency of blue light) | 26.2% | 17.4% | 12.9% |
| Excitation light external quantum efficiency ηee (External quantum efficiency of excitation light) | 14.4% | 14.6% | 13.6% |

This is because the light extraction efficiency from a nitride semiconductor having a high refractive index to a resin is greater than the light extraction efficiency to air. Most of the excitation light emitted into the transparent resin is totally reflected by the light emitting surface; however, the incident angle on the light emitting surface changes every time the light is reflected by the reflective wall 34, so that the excitation light is emitted to the outside from the light emitting surface after repeatedly reflected several times. Accordingly, in a case where a reflective wall that is inclined so as to open in the light emission direction is provided, the light extraction efficiency is improved.

Since the blue micro light emitting element 100B includes the transparent portion 31, the emission distribution of blue light can be brought close to the emission distribution of red light or green light. FIG. 7 shows simulation results for light emission angle dependency of light emission intensity at θw=65 degrees. FIG. 7 shows the light emission angle distribution for blue light (transparent portion) from the transparent portion 31, red light (Red-QD) from the red wavelength conversion portion 32, and blue light (Air) emitted from the excitation light emitting element directly into the air. It can be seen that the emission angle distribution of blue light gets closer to that of red light because of the transparent portion 31. In the case of direct view display elements, in a case where the light emission angle distribution varies greatly depending on the color, a problem arises in that the color changes depending on the viewing direction. In the present configuration, such problems can be reduced. In a case of being used in AR glasses applications, a light distribution control member similar to a case of red light or green light can also be applied to the blue subpixel 6 to align the light distribution of the RGB 3 primary colors. In a case where the blue subpixel 6 does not include the transparent portion 31, a large recessed portion is formed, and this makes it difficult to form the light distribution control member. Since the transparent portion 31 is present, the surface shape of each of the RGB subpixels can be aligned, making it easy to form the light distribution control member.

The method of manufacturing the image display element 200a is the same as that of the first embodiment. In other words, the full color display element can be manufactured by sequentially forming the respective wavelength conversion portion or transparent portion in each subpixel after steps (3-0) to (3-14) of FIGS. 3A to 3D.

As described above, a bus tab shape is formed by covering the periphery of the excitation light emitting element that emits blue light with the reflective wall, the inside of the bus tab of the red subpixel is filled with the red wavelength conversion material, the inside of the bus tab of the green subpixel is filled with the green wavelength conversion material, and the inside of the bus tab of the blue subpixel is filled with the transparent resin, so that the excitation light emitting element is covered by the wavelength conversion material or the transparent resin, except for the surface closer to the driving circuit substrate. Furthermore, the light emission layer of the excitation light emitting element is disposed on the opposite side to the driving circuit substrate, and the reflective wall is inclined so as to open with respect to the light emission direction of the micro light emitting element, which can provide a full color display element having the increased external emission efficiency of each subpixel. Furthermore, aligning the light distribution characteristics of each subpixel allows changes in color depending on the viewing direction to be suppressed, and aligning the surface shape of each subpixel allows the light distribution control member to be easily disposed.

Third Embodiment

Configuration of Image Display Element 200b

Another embodiment of the disclosure will be described below with reference to FIGS. 8 to 9C. Note that, for convenience of description, components having the same functions as those described in the embodiments described above will be denoted by the same reference signs, and descriptions of those components will be omitted. The image display element 200b according to the third embodiment differs from the second embodiment in that the P-drive electrode 52 is not disposed in the pixel area 1. Other points are the same as in the second embodiment.

As illustrated in FIG. 8, a plurality of blue micro light emitting elements 100Bb, a plurality of red micro light emitting elements 100Rb, and a plurality of green micro light emitting elements 100Gb constituting the image display element 200b each have only the N electrode 23N in the pixel area 1, and the transparent electrode 30 connected to the P-side layer 13 is connected to the reflective material 36. The reflective material 36 acts as a wiring line material, and is connected to the P-drive electrode 52 with the P electrode 23P therebetween outside the pixel area 1 (not illustrated). In the present configuration, the N electrode 23N can cover a wide region of the subpixel, excluding the periphery of the subpixel. As a result, the overlapping region with the reflective material 36 in a plan view can be made wide. Accordingly, the exposed region of the driving circuit substrate 50b in a plan view is eliminated, and the leakage of light to the driving circuit substrate 50b can be reduced.

A method of manufacturing the image display element 200b is illustrated in FIGS. 9A to 9C. The steps from (3-0) of FIG. 3A to (3-5) of FIG. 3B are the same, and thus are omitted. (9-1) of FIG. 9A is the same as (3-5) of FIG. 3. In (9-2) of FIG. 9A, the driving circuit substrate 50b is attached; however, the present embodiment differs from the first and second embodiments in that the driving circuit substrate 50b does not include a P-drive electrode 52 in the pixel area 1. Next, at (9-3) of FIG. 9A, the transfer substrate 10 is peeled off.

Next, in (9-4) of FIG. 9A, the electrode film 23L is processed into an N electrode 23N by using photolithography and dry etching techniques. A portion of the electrode film 23L at the boundary between the subpixels is removed, and the N electrode 23N is preferably configured to cover the subpixel as wide as possible. Next, as illustrated in (9-5) of FIG. 9A, a transparent insulating film 17 is deposited as a protection film. In addition, as illustrated in (9-6) of FIG. 9B, a P contact hole 18P is opened on an upper portion of the main body 16, and a transparent electrode 30 is formed as illustrated in (9-7) of FIG. 9B. Note that the transparent insulating film 17 is preferably formed as thin as possible as long as the N electrode 23N can be insulated from the transparent electrode 30. In the pixel area 1, since the transparent insulating film 17 spans and is continuous between subpixels, in a case where the transparent insulating film 17 is thick, optical crosstalk is generated between subpixels via the transparent insulating film 17.

Next, as illustrated in (9-8) of FIG. 9B, a base material 35 is formed, and as illustrated in (9-9) of FIG. 9B, a reflective material film 36L is deposited and processed into the reflective material 36 by using photolithography and dry etching techniques. The reflective material 36 is electrically connected to the transparent electrode 30 at the bottom portion. The bottom portion of the reflective material 36 preferably extends from the end portion of the base material 35 toward the main body 16 and preferably overlaps the N electrode 23N as wide as possible as long as the bottom portion does not cover the side surface of the main body 16. Furthermore, as illustrated in (9-10) of FIG. 9C, the red wavelength conversion portion 32, the green wavelength conversion portion 33, and the transparent portion 31 are formed for each subpixel, in a similar manner as the second embodiment.

According to the present configuration, the same effects as those of the second embodiment can be achieved. Furthermore, the leakage of light to the driving circuit substrate 50b can be reduced, malfunction of the driving circuit can be prevented, and optical crosstalk between subpixels via the driving circuit substrate 50b can be reduced.

Modified Example

A modified example of the third embodiment is illustrated in FIG. 10. Note that in FIG. 10, the case of a single color display element such as that of the first embodiment is illustrated; however, application to full color is also possible.

In the image display element 200c illustrated in (10-1) of FIG. 10, the reflective wall 34c is different from that of the first embodiment and is made of a metal material. Since it is necessary that the reflective wall has a sidewall that is inclined so as to open with respect to the light emission direction, and the light reflectivity of the sidewall is high, as illustrated in (10-1) of FIG. 10, the reflective wall may be made of a single metal material, or the reflective wall may be made of a combination of a plurality of materials as illustrated in FIG. 1.

The reflective wall 34d of the image display element 200d illustrated in (10-2) of FIG. 10 includes an bent side surface. The side of the reflective wall is not limited to being composed of a single inclined surface as in the first embodiment. The side of the reflective wall may be a combination of a plurality of inclined surfaces or a curved surface. The reflective wall preferably has a sidewall that is inclined so as to open with respect to the light emission direction, and the average inclination angle thereof is preferably small (for example, the inclination angle θw1> inclination angle θw2).

As described above, the same effects as those of the first embodiment can be achieved even in the configuration of the image display element 200c or 200d.

Fourth Embodiment

Another embodiment of the disclosure will be described below with reference to FIGS. 11 to 12B. Note that, for convenience of description, components having the same functions as those described in the embodiments described above will be denoted by the same reference signs, and descriptions of those components will be omitted. The image display element 200e according to the fourth embodiment differs from the other embodiments in that the image display element 200e includes a light blocking material 37 under the reflective wall 34c as illustrated in FIG. 11. The light blocking material 37 is an insulating light absorbing material or a light reflective material. For example, the light blocking material 37 is a resin material containing a high concentration of nanoparticle-shaped carbon black or a material in which metal nanoparticles are coated with an insulating film such as a $SiO_2$ film and dispersed in a resin at a high concentration. The light blocking material 37 fills a gap between adjacent N electrodes 23N, and partitions the transparent insulating film 17 and the transparent electrode 30 between subpixels. In a case where the reflective wall is made of metal like the reflective wall 34c, optical crosstalk between subpixels can be completely prevented. Light leakage to the driving circuit substrate 50b can also be prevented.

The manufacturing process of the image display element 200e will be described using FIGS. 12A and 12B. (12-1) of FIG. 12A is the same as (9-3) of FIG. 9A, and the steps of forming the image display element 200e to this step is the same as in the second embodiment. Next, as illustrated in (12-2) of FIG. 12A, the transparent insulating film 17 is deposited without processing the electrode film 23L. The formation of the P contact hole 18P and the formation of the transparent electrode 30 illustrated in (12-3) and (12-4) of FIG. 12A are the same as in the second embodiment.

Next, as illustrated in (12-5) of FIG. 12B, the transparent electrode 30, the transparent insulating film 17, and the electrode film 23L at the boundary between the subpixels are removed by using photolithography techniques and dry etching techniques to form a groove 24. As a result, the N electrode 23N of the excitation light emitting element 105 of each subpixel is formed. Next, the light blocking material 37 is formed so as to fill the groove 24. A resist pattern having an opening at a position of the groove 24 may be produced by a photolithography method, and a light blocking material may be poured into the opening, or the light blocking material 37 may be patterned and formed directly by a resist material serving as a light blocking material.

Next, a lift-off method is used to deposit a metal film to form a reflective wall 34c. A metal film covering the entire surface may be deposited, and the metal film at a position other than the boundary portion between the subpixels may be removed by using photolithography and dry etching techniques to form the reflective wall 34c. The sidewalls of the reflective wall 34c are inclined so as to open in the light emission direction. The step of forming the wavelength conversion portion is the same as that in other embodiments, and thus is omitted.

As described above, the same effects as those of the first embodiment can be achieved even in the configuration of the image display element 200e. An effect of preventing light leakage to the driving circuit substrate or adjacent pixels and reducing optical crosstalk is also achieved.

Fifth Embodiment

Configuration of Image Display Element 200f

Another embodiment of the disclosure will be described below with reference to FIGS. 13 to 14D. Note that, for convenience of description, components having the same functions as those described in the embodiments described above will be denoted by the same reference signs, and descriptions of those components will be omitted. For the image display element 200f of the fifth embodiment, a single color display element similar to that in the first embodiment is illustrated, and the image display element 200f is the same as that of the second embodiment in that the pixel area 1 does not include the P-drive electrode 52. In the second embodiment, the N electrode 23 occupies a large portion with respect to the area of the subpixel; however, in the present embodiment, the N-drive electrode 51 occupies a large portion with respect to the area of the pixel. The present embodiment differs from other embodiments in the manufacturing method. In the previous embodiments, a large portion of the nitride semiconductor layer 14 have been lost due to the formation of the separation trench 15, which is intended to be utilized for the display element in this embodiment.

FIG. 13 illustrates a cross-sectional schematic view of the image display element 200f that is a single color display element. The N electrode 23N covers only the bottom portion of the main body 16, with the N-drive electrode 51 having a larger area than the N electrode 23N, preventing light leakage to the driving circuit substrate 50f. The space between adjacent N-drive electrodes 51 is covered by the bottom portion of the reflective wall 34c, and in a plan view, the N-drive electrode 51 and the reflective wall 34c overlap, reducing the leakage of light to the driving circuit substrate 50f. The driving circuit substrate 50f is similar to the driving circuit substrate 50b, but differs in that the electrode area of the N-drive electrode 51 is wide. To completely prevent light leakage, as in the fourth embodiment, the transparent electrode 30 and the transparent insulating film 17 at the bottom portion of the reflective wall 34c may be removed, and the light blocking material 37 may be disposed. In FIG. 13, the reflective wall 34c is constituted of a metal material; however, as in the first embodiment, the reflective wall 34c may be formed by combining the base material 35 and the reflective material 36.

The manufacturing process of the image display element 200f is illustrated in FIGS. 14A to 14D. The step of growing the nitride semiconductor layer 14 on the growth substrate 9 illustrated in (14-0) of FIG. 14A is the same as that in other embodiments. Next, as illustrated in (14-1) of FIG. 14A, the separation trench 15 is formed, and a portion that forms the main body 16 is formed. Different from the other embodiments is that the arrangement pitch of the main body 16 is half of the arrangement pitch of the pixels 5. That is, the number of main bodies 16 per unit area is four times the density of the pixels 5, and only ¼ of the main body 16 illustrated in (14-1) of FIG. 14A is used for one image display element 200f. The rest is used for other image display elements. Thus, a fourfold number of image display elements 200f can be produced from the nitride semiconductor layer 14 grown on the growth substrate 9 as compared to other embodiments. Note that in the present embodiment, the main body 16 is formed in half of the pixel pitch; however, the main body 16 can also be formed in ⅓ or ¼ of the pixel pitch. The image display element 200f can be produced in a quantity of 9 times or 16 times in each case.

Next, as illustrated in (14-2) of FIG. 14A, the growth substrate 9 and the transfer substrate 10 are bonded by bringing the main body 16 side toward the transfer substrate 10. At this time, the separation trench 15 is filled with a filling material 19. The filling material 19 is a $SiO_2$ film or a resin film, and may be a material that can be selectively removed from the nitride semiconductor layer 14. The surface of the main body 16 and the transfer substrate 10 are bonded via an adhesive material 4. The adhesive material 4 is a resin material that loses adhesive strength by spot light in a later step. In a case where the spot light is an ultraviolet laser light, the adhesive material 4 is a resin material that absorbs ultraviolet light and loses adhesive strength. In a case where the spot light is a visible light laser or an infrared light laser, the adhesive material 4 is a resin material that loses adhesive strength by swelling by heating. The transfer substrate 10 is preferably transparent to spot light.

Then, the growth substrate 9 is peeled off as illustrated in (14-3) of FIG. 14A, and the N-side layer 11 is polished as illustrated in (14-4) of FIG. 14A, and the step of separating the main bodies 16 from each other is similar to steps illustrated in (3-3) and (3-4) of FIG. 3A. Next, as illustrated in (14-5) of FIG. 14B, the electrode film 23L and the cover film 25 are deposited. The electrode film 23L is similar to that in (3-5) of FIG. 3B. The cover film 25 is made of a material that prevents the connection between the N electrode 23N and the N-drive electrode 51, and is, for example, a $SiO_2$ film that is very thin. The cover film 25 is preferably thin and is preferably from 10 nm to 100 nm.

Next, as illustrated in (14-6) of FIG. 14B, a photolithography technique and a dry etching technique are used to remove a portion of the cover film 25 and the electrode film 23L at a position other than a position of the main body 16. As a result, the N electrode 23N is formed on each of the main bodies 16. The filling material 19 in the separation trench 15 between the main bodies 16 is preferably simultaneously removed at this time. Subsequently, as illustrated in (14-7) of FIG. 14B, a photolithography technique and dry etching technique or wet etching technique are used to remove the cover film 25 on the main body 16 that is to be bonded to the driving circuit substrate 50f.

Next, as illustrated in (14-8) of FIG. 14B, the main body 16 side is faced to the driving circuit substrate 50f, and the transfer substrate 10 and the driving circuit substrate 50f are bonded together. At this time, the transfer substrate 10 and the driving circuit substrate 50f are precisely aligned such that the main body 16 with the cover film 25 removed overlaps the center of the corresponding N-drive electrode 51. The N-drive electrode 51 and the N electrode 23N not covered by the cover film 25 are joined at this stage; however, the N electrode 23N covered by the cover film 25 is not joined to the driving circuit substrate 50f. Next, spot light is emitted from the transfer substrate 10 side to the adhesive material 4 in contact with the main body 16, the main body 16 being coupled to the N-drive electrode 51 with the N electrode 23N therebetween, to lose the adhesive strength of the adhesive material 4.

Next, as illustrated in (14-10) of FIG. 14C, the transfer substrate 10 is disconnected from the driving circuit substrate 50f. The remaining main body 16 on the transfer substrate 10 is utilized in the manufacture of other image display elements 200f by repeating the subsequent steps of (14-7) of FIG. 14B for the other driving circuit substrate 50f. In this way, the nitride semiconductor layer 14 can be used without waste.

Next, similar to (9-5) of FIG. 9A to (9-7) of FIG. 9B, a transparent insulating film 17 is deposited as a protection film as illustrated in (14-11) of FIG. 14C, a P contact hole 18P is opened on the upper portion of the main body 16 as illustrated in (14-12) of FIG. 14C, and the transparent electrode 30 is formed as illustrated in (14-13) of FIG. 14C. Furthermore, as illustrated in (14-14) of FIG. 14D, a lift-off method is used to deposit a metal film to form a reflective wall 34c. A metal film covering the entire surface may be deposited, and the metal film at a position other than the boundary portion between the subpixels may be removed by using photolithography and dry etching techniques to form the reflective wall 34c. The sidewalls of the reflective wall 34c are inclined so as to open in the light emission direction. Next, as illustrated in (14-15) of FIG. 14D, the red wavelength conversion portion 32 is formed.

As described above, the same effects as those of the first embodiment can be achieved even in the configuration of the image display element 200f. Furthermore, the nitride semiconductor layer 14 constituting the excitation light emitting element 105 can be effectively utilized.

Sixth Embodiment

Another embodiment of the disclosure will be described below with reference to FIG. 15. Note that, for convenience of description, components having the same functions as those described in the embodiments described above will be denoted by the same reference signs, and descriptions of those components will be omitted. The image display element 200g according to the sixth embodiment has the same structure as that of the image display element 200b of the full color display of the third embodiment and differs from the image display element 200b in that, as illustrated in FIG. 15, the transparent portion 31g of the blue micro light emitting element 100Bg is constituted by the first layer 31F and the second layer 31S. The refractive index of the first layer 31F is less than that of the second layer 31S. The upper surface of the first layer 31F serves as the light emitting surface 130.

The light output of the blue micro light emitting element 100Bg can be improved by a transparent portion having at least a dual-layer structure such as this type. The arrangement pitch is 4 µm, the main body 16 is square, the length of one side is 1.0 µm, the inclination angle θb of the sidewall is 89°, the thickness of the P-side layer 13 is 100 nm, and the thickness of the N-side layer 11 is 1.0 µm. The simulation results for light extraction efficiency of blue light (a wavelength is 450 nm), which is excitation light, is shown in Table 4 in a case where the height of the reflective wall 34 is 3.2 µm and θw=65 degrees. The thickness and the refractive index of the first layer 31F are 1.0 µm and 1.2, respectively. The thickness and the refractive index of the second layer 31S are 2.1 µm and 1.8, respectively. The refractive index of the resin constituting a regular uniform transparent portion 31 is 1.62.

TABLE 4

|  | Single layer structure | Dual-layer structure |
| --- | --- | --- |
| Light extraction efficiency of Blue light | 49.2% | 52.5% |

Compared to a case where the transparent portion is constituted by a single layer, in the dual-layer configuration of the present configuration, an improved effect of approximately 7%, namely, from 49.2% to 52.5%, is achieved. Such an improvement effect is greater as the θw is smaller, and there is no improvement effect at θw=90 degrees. In a structure having a reflective wall that is inclined so as to open in the light emission direction, the light extraction efficiency of blue light, which is excitation light, can be improved by disposing a material having a low refractive index near the light emitting surface and disposing a material having a higher refractive index on the lower surface side thereof. This is because in a case where the nitride semiconductor is covered with a resin having a high refractive index, the light extraction efficiency into the resin can be increased. In a case where a resin having a low refractive index is simply interposed between the resin having a high refractive index and air, the amount of light emitted into the air does not increase; however, the incident angle on the light emitting surface changes due to the reflection by the reflective wall 34 surrounding the periphery of the resin having a high refractive index and the resin having a low refractive index, and the light is emitted to the outside from the light emitting surface after repeatedly reflected several times. As a result, the light extraction efficiency can be improved by providing a resin having a high refractive index and a resin having a low refractive index in the reflective wall that is inclined so as to open in the light emission direction.

Like the red micro light emitting element 100Rg illustrated in FIG. 15, the red wavelength conversion portion 32g of the red micro light emitting element 100Rg may also be constituted by the first layer 32F and the second layer 32S.

The green wavelength conversion portion 33g of the green micro light emitting element 100Gg may also be constituted by the first layer 33F and the second layer 33S. The refractive indices of the first layers 32F and 33F are less than the refractive indices of the second layers 32S and 33S, respectively, and the first layers 32F and 33F may be transparent resins that do not include a wavelength conversion material. The simulation results for the light emission efficiency for the red micro light emitting element 100Rg having the same configuration as the blue micro light emitting element 100Bg is shown in Table 5. In a case of a single layer structure, the refractive index of the red wavelength conversion portion is 1.713+0.023 j, and in a case of a dual-layer structure, the refractive index of the second layer is 1.806+0.047 j, and the refractive index of the first layer is 1.6207. In a case of a dual-layer structure, it is assumed that the second layer contains nearly twice the wavelength conversion material (quantum dots, or the like) compared to the case of a single layer structure.

TABLE 5

|  | Single layer structure | Dual-layer structure |
| --- | --- | --- |
| Excitation light absorption amount (A) (Excitation light absorption) | 78.5% | 85.7% |
| Excitation light leakage amount (Excitation light leakage) | 6.2% | 4.2% |
| Light extraction efficiency of red light (B) Red light extraction efficiency | 53.3% | 54.2% |
| (A) * (B) | 41.9% | 46.4% |

With such a structure, it is possible to improve both the excitation light absorption amount and the light extraction efficiency of red light. As a result, the improved efficiency of approximately 10%, namely from 41.9% to 46.4%, can be achieved.

The structure like the image display element 200g may be formed by first forming the second layer in the step of forming the wavelength conversion portion or the transparent portion, and then forming the first layer. The first layer may have the same thickness or different thicknesses for each subpixel. In a case where the thickness of the second layer differs between subpixels, the height of the light emitting surface 130 between subpixels can be common by simultaneously forming the first layers. This results in the advantage that the formation of the light distribution member is facilitated.

As described above, the same effects as those of the first embodiment can be achieved even in the configuration of the image display element 200g. Furthermore, the light output of the micro light emitting element can be improved.

Seventh Embodiment

Another embodiment of the disclosure will be described below with reference to FIGS. 16 to 18. Note that, for convenience of description, components having the same functions as those described in the embodiments described above will be denoted by the same reference signs, and descriptions of those components will be omitted. The image display element 200h according to the seventh embodiment has the same structure as that of the image display element 200b of the full color display according to the third embodiment and differs from the image display element 200b in that, as illustrated in FIGS. 16 and 17, Nano-Antenna Arrays (NAA) 70R, 70G, and 70B are disposed on the light emitting surface 130 of each subpixel as a light distribution control member. Note that FIG. 16 is a cross-sectional schematic view at the dashed line C-C portion of FIG. 17.

The antenna array 70R, 70G, or 70B is formed such that isolated protruding portions 71R, 71G, or 71B are regularly disposed, respectively, and are disposed in a certain pattern with respect to the light emitting surface 130 of the micro light emitting elements 100Rh, 100Gh, or 100Bh, respectively. In FIG. 17, a protruding portion 71R, 71G, or 71B is disposed at a vertex of an equilateral triangle in a plan view. The distance between adjacent protruding portions (in the present embodiment, the length of one side of the square) is referred to as the period. For example, the shape of the protruding portion 71R, 71G, or 71B is circular, the diameter is approximately 100 nm, and the height is approximately 150 nm.

The size, shape, height, and arrangement pattern of the protruding portion 71R, 71G, or 71B are preferably optimized as appropriate for the material of the light emitting surface 130 and each of the subpixels. To prevent the amount of light passing through the antenna array 70R, 70G, or 70B from reducing, the dimension of the protruding portion in the horizontal direction is preferably ½ or less with respect to the distance between adjacent protruding portions 71R, 71G, and 71B. To reduce the effect on the light passing therethrough in the polarization direction, an aspect ratio (=height/dimension in the horizontal direction of the protruding portion), which is a ratio of the height to the horizontal dimension of the protruding portion, is preferably between 0.5 and 2.0, and more preferably between 0.75 and 1.5. In the present configuration, the protruding portion 71R, 71G, or 71B may be made of a metal material such as aluminum or silver, or a semiconductor material such as silicon, or may be a dielectric film such as a titanium oxide film ($TiO_2$), a silicon nitride film (SiN), or a resin. The dielectric film preferably has a high refractive index.

Such a pattern can be formed by depositing a film made of the material constituting the protruding portion on the light emitting surface 130, forming a resist pattern at a position corresponding to the protruding portion, and etching by using a dry etching technique. The resist pattern can be formed by using a photolithography technique or a nanoimprint technique. In the present configuration, the antenna array 70R, 70G, and 70B are precisely aligned with the array arrangement of the micro light emitting elements 100Rh, 100Gh, and 100Bh. In the case of a single color display element, alignment is not necessarily required.

In the present configuration, antenna arrays with different patterns are disposed with respect to the micro light emitting elements 100Rh, 100Gh, and 100Bh. A blue light antenna array 70B is disposed on the surface of the transparent portion 31, which is a light emitting surface of the blue micro light emitting element 100Bh, a red light antenna array 70R is disposed on the surface of the red wavelength conversion portion 32, which is a light emitting surface of the red micro light emitting element 100Rh, and a green light antenna array 70G is disposed on the surface of the green wavelength conversion portion 33, which is a light emitting surface of the green micro light emitting element 100Gh. For example, the period of the blue light antenna array 70B is 475 nm, the period of the green light antenna array 70G is 555 nm, the period of the red light antenna array 70R is 675 nm, and the arrangement patterns of the protruding portions are the same pattern. In a case where the optimal value of the period is P, and the center wavelength of the emission peak is $\lambda$, $n*P/\lambda$ is roughly constant. In the configuration of FIG. 16, since the difference in the refractive index of the light emitting surface of each subpixel is not large, the antenna array period of each subpixel is approximately proportional to the wavelength. Therefore, the relationship "the period of the blue light antenna array 70B< period of the green light antenna array 70G< red light antenna array 70R period" is satisfied. Note that in FIG. 16 and FIG. 17, the protruding portions of the antenna array are disposed only on the light emitting surface 130; however, the protruding portions 71R, 71G, and 71B may be disposed on the surface of the reflective wall 34.

A comparison between light distributions of the red micro light emitting element 100Rh and the blue micro light emitting element 100Bh in the present configuration is shown in FIG. 18. All are normalized with respect to maximum values. Each of the light distributions before and after nano-antenna array formation is shown. In either case, a light emission intensity in a case where the light emission angle is less than or equal to 20 degrees is increased because of the nano-antenna array, and the light distributions of the red micro light emitting element 100Rh and the blue micro light emitting element 100Bh are closely matched. The amount of red light emitted in the case where the light emission angle is less than or equal to 20 degrees is increased by about three times, and the amount of blue light emitted in the same case is increased by approximately four times, depending on the arrangement of the nano-antenna array. In a case where the nano-antenna array is disposed in this way, the light emission intensity to the front can be increased, and the light emission angle distribution of each light emission color can be aligned.

As described above, the same effects as those of the first embodiment can be achieved even in the configuration of the image display element 200h. Furthermore, the light emission intensity to the front of the micro light emitting element can be increased.

Eighth Embodiment

Another embodiment of the disclosure will be described below with reference to FIG. 19. Note that, for convenience of description, components having the same functions as those described in the embodiments described above will be denoted by the same reference signs, and descriptions of those components will be omitted. The image display element 200i according to the eighth embodiment has the same structure as that of the image display element 200b of the full color display of the third embodiment and differs from the image display element 200b in that, as illustrated in FIG. 19, a micro lens 72 and a reflective wall surrounding the outer periphery of the micro lens 72 are disposed as a light distribution control member on the light emitting surface 130 of each subpixel. In the present configuration, the reflective wall 34 is formed higher than the wavelength conversion portions 32 and 33 and the transparent portion 31, and is also used as a mirror surrounding the outer periphery of the micro lens 72.

The light emission intensity angle distribution of the red micro light emitting element 100Ri is shown in FIG. 20. A case where there is no micro lens 72 and mirror, that is, a case where the reflective wall 34 is at the same height as the light emitting surface of the red wavelength conversion portion 32, and a case where only the micro lens 72 is present are shown for comparison. Although the amount of light emitted increases due to the provision of the micro lens 72, the amount of light emitted increases mainly in a region where the light emission angle is 50 degrees or greater, and the light emission intensity to the front does not increase. That is, with the micro lens 72 alone, it is not possible to increase the light emission intensity to the front, and such a configuration is not sufficient as the light distribution control member. However, in a case where the mirror (a part of the reflective wall 34) surrounding the outer periphery of the micro lens 72 is provided, the light emission intensity to the front can be greatly increased.

The cross-sectional shape of the micro lens 72 may be a lens shape, and the same effect can be obtained even in a case where the planar shape is rectangular. In a case where the curved surface of the cross-sectional shape of the micro lens is approximated by a circle, the radius is preferably approximately half the length of one side of the light emitting surface of the red wavelength conversion portion 32. The height of the reflective wall 34 is preferably the same as the height of the micro lens 72.

The same applies to the green micro light emitting element 100Gi. For the blue micro light emitting element 100Bi, the effect of the micro lens 72 and the reflective wall 34 is not great, so the micro lens 72 can be omitted.

As described above, the same effects as those of the first embodiment can be achieved even in the configuration of the image display element 200i. Furthermore, the light emission intensity to the front of the micro light emitting element can be increased.

Ninth Embodiment

Another embodiment of the disclosure will be described below with reference to FIGS. 21 to 23C. Note that, for convenience of description, components having the same functions as those described in the embodiments described above will be denoted by the same reference signs, and descriptions of those components will be omitted. The image display element 200j according to the ninth embodiment has the same structure as that of the image display element 200b of the full color display according to the third embodiment and differs from the image display element 200b in that, as illustrated in FIG. 21, the excitation light emitting element 105j includes a plurality of transparent electrodes 30A and 30B. By dividing the transparent electrode into a plurality, a redundant function can be added to the excitation light emitting element 105j. Therefore, the yield reduction due to the light emission failure of the excitation light emitting element 105j can be suppressed, and the yield of the image display element 200j can be increased. Note that in FIG. 21, the shape of the red micro light emitting element 100Rj after saved by the redundant function is illustrated, and for the green micro light emitting element 100Gj and the blue micro light emitting element 100Bj, the shape of subpixels that need not be saved by the redundant function is illustrated.

As illustrated in FIG. 22, a plurality of transparent electrodes 30A and 30B separated from each other with respect to the main body 16 are disposed, and both are covered by a second protection film 20. For one transparent electrode (transparent electrode 30B in FIG. 22), an opening 21 is provided in the second protection film 20, and an opening is not provided for the other. In the opening 21, the reflective material 36 that serves as the common wiring line on the P-side is connected to the transparent electrode 30B. Therefore, typically, a current flows to the excitation light emitting element 105j via the transparent electrode 30B, and the light emission is controlled. However, in a case where no current flows through the transparent electrode 30B (conduction failure), in a case where the current flows excessively (leak failure), or in a case where the current flows; however, the amount of light does not meet specifications (light emission failure), the transparent electrode 30B is disconnected from the reflective material 36 and the transparent electrode 30A is connected to the reflective material 36, which may improve the light emission characteristics of the excitation light emitting element 105j. In a case where the light emission can be controlled by causing a current to flow from the transparent electrode 30A, the occurrence of pixel failure can be prevented and yield can be improved.

In the configuration in which the inclined reflective wall 34 is disposed surrounding the excitation light emitting element 105j, and the wavelength conversion portion and the transparent portion are disposed inside the reflective wall 34 and cover the excitation light emitting element 105j as in the present configuration, the light emission efficiency can be improved by reducing the planar size of the main body 16 compared to the planar size of the subpixels. Since the excitation light emitting element 105j is small compared to the subpixel size, as illustrated in FIG. 22, a portion (cutting portion 22D) for cutting the conduction point between the transparent electrode and the reflective material 36 and a portion (connection portion 22C) for newly connecting the transparent electrode and the reflective material 36 can be provided. In other words, in the present configuration, improvements in light emission efficiency and yield improvement utilizing redundancy can be achieved simultaneously.

As illustrated in FIG. 22, in a case where the reflective material 36 at the cutting portion 22D is formed in a neck-like shape, the reflective material 36 can be easily cut by laser spot light or Focused Ion Beam (FIB). In the connection portion 22C, the second protection film 20 can be broken by laser spot light or FIB, and the transparent electrode 30A and the reflective material 36 can be brought into contact with each other.

As illustrated in FIG. 22, in the present configuration, in a top view, there is a large opening in the bottom portion of the reflective material 36; however, the N electrode 23N extending to the outside of the main body 16 suppresses light leakage to the driving circuit substrate 50b. Since the P-side layer 13 is generally highly resistive, current flows a little in the horizontal direction in a case where the P-side layer 13 is thin, and as illustrated in FIG. 21, the P-side layer 13 needs not be divided into the transparent electrode 30A and 30B sides; however, the P-side layer 13 may be divided so as to connect with the transparent electrode 30A and 30B sides.

The manufacturing process of the image display element 200j will be described with reference to FIGS. 23A to 23C. (23-0) of FIG. 23A is the same as (9-7) of FIG. 9B, and the previous steps are the same as those in the third embodiment. Next, as illustrated in (23-1) of FIG. 23A, the transparent electrode film is processed into the transparent electrodes 30A and 30B by a photolithography technique and dry etching technique or wet etching technique. Note that in FIGS. 23A to 23C, the P contact hole 18P is opened on the upper portion of the main body 16 as a single hole, but may be formed as two holes, and the transparent electrode 30A and the P-side layer 13 may be connected in one hole, and the transparent electrode 30B and the P-side layer 13 may be connected in the other hole.

Next, as illustrated in (23-2) of FIG. 23A, a transparent insulating film is deposited to form a second protection film 20. Next, as illustrated in (23-3) of FIG. 23B, an opening 21 is provided in the second protection film 20 on the transparent electrode 30B on the outside of the main body 16. Next, as illustrated in (23-4) and (23-5) of FIG. 23B, a base material 35 is formed, and a reflective material 36 is further formed. The reflective material 36 is electrically connected to the transparent electrode 30B at the opening 21. Next, the excitation light emitting element 105j is tested for light emission, and a defective product of the excitation light emitting element 105j is detected. Hereinafter, a case where a defect has been found in a central subpixel is described.

Next, for the defective subpixels, the reflective material 36 and the transparent electrode 30B are cut away at the cutting portion 22D, and the transparent electrode 30A and the reflective material 36 are electrically connected at the connection portion 22C. Note that in a case where the defective condition is poor in continuity, the separation of the reflective material 36 and the transparent electrode 30B may be omitted. Again, a light emission test is performed to confirm the improvement of the characteristics, and the wavelength conversion portions 32 and 33 and the transparent portion 31 in (23-7) of FIG. 23C are formed to complete the image display element 200j.

Note that a configuration having only the cutting portion 22D in the present configuration is also possible. In other words, the configuration is such that, in a configuration having a single transparent electrode, the connection portion of the transparent electrode and the reflective material (P-side common wiring line) can be cut away. A defection on the driving circuit substrate 50b side may cause a bright spot failure in which a current flows constantly through the micro light emitting element, and the micro light emitting element constantly illuminates. In this type of bright spot failure, by cutting the cutting portion 22D, the current is blocked, and the constant lighting failure can be changed to black spot failure. Although bright spot failure is not acceptable, black spot failure may be acceptable, so the failure rate can be reduced.

As described above, the same effects as those of the first embodiment can be achieved even in the configuration of the image display element 200j. Furthermore, the manufacturing yield of the image display element can be improved.

What is claimed is:

1. An image display element comprising:
   micro light emitting elements disposed in an array on a driving circuit substrate including a driving circuit configured to supply a current to the micro light emitting elements and cause the micro light emitting elements to emit light,
   wherein each of the micro light emitting elements emits light in a direction opposite the driving circuit substrate,
   each of the micro light emitting elements includes an excitation light emitting element configured to generate excitation light, a reflective wall surrounding the excitation light emitting element, and a wavelength conversion material disposed inside the reflective wall,
   a sidewall of the reflective wall is not in contact with a sidewall of the excitation light emitting element and is inclined to open with respect to a light emission direction of each of the micro light emitting elements,
   the wavelength conversion material absorbs the excitation light and emits light having a wavelength longer than a wavelength of the excitation light,
   the wavelength conversion material covers all surfaces of the excitation light emitting element excluding a surface of the excitation light emitting element closer to the driving circuit substrate, and
   the excitation light emitting element includes a main body including a compound semiconductor, a metal electrode disposed on a first side of the main body relatively closer to the driving circuit substrate, and a transparent electrode disposed on a second side of the main body relatively farther from the driving circuit substrate,
   wherein a light blocking material having insulation properties is disposed at a bottom portion of the reflective wall, and
   the light blocking material is in contact with the metal electrode and the reflective wall.

2. The image display element according to claim 1, wherein each of the micro light emitting elements further includes a light distribution control member on a light emitting surface.

3. The image display element according to claim 1, wherein the metal electrode and the reflective wall overlap each other in a plan view.

4. The image display element according to claim 1, wherein an area of a drive electrode on the driving circuit substrate to which the metal electrode is connected is less than an area of the metal electrode.

5. The image display element according to claim 1, wherein an area of a drive electrode on the driving circuit substrate to which the metal electrode is connected is greater than an area of the metal electrode.

6. The image display element according to claim 1, wherein each of the micro light emitting elements further includes a resin layer disposed on the wavelength conversion material between the reflective wall, wherein a refractive index of the resin layer is less than a refractive index of the wavelength conversion material.

7. The image display element according to claim 1, wherein an inclination angle of a side surface of the reflective wall ranges from 85 degrees to 45 degrees.

8. The image display element according to claim 1, wherein the excitation light emitting element further includes a plurality of the transparent electrodes.

9. The image display element according to claim 1, wherein an N-side layer included in the main body is disposed on the first side and a P-side layer included in the main body is disposed on the second side.

10. An image display element comprising:
    micro light emitting elements disposed in an array on a driving circuit substrate including a driving circuit configured to supply a current to the micro light emitting elements and cause the micro light emitting elements to emit light,
    wherein each of the micro light emitting elements emits light in a direction opposite the driving circuit substrate,
    each of the micro light emitting elements includes an excitation light emitting element configured to generate excitation light, a reflective wall surrounding the excitation light emitting element, and a transparent portion disposed inside the reflective wall,
    a sidewall of the reflective wall is not in contact with a sidewall of the excitation light emitting element and is inclined to open with respect to a light emission direction of each of the micro light emitting elements,
    the transparent portion covers all surfaces of the excitation light emitting element excluding a surface of the excitation light emitting element located closer to the driving circuit substrate, and
    the excitation light emitting element includes a main body including a compound semiconductor, a metal electrode disposed on a first side of the main body relatively closer to the driving circuit substrate, and a transparent electrode disposed on a second side of the main body relatively farther from the driving circuit substrate, wherein a light blocking material having insulation properties is disposed at a bottom portion of the reflective wall, and the light blocking material is in contact with the metal electrode and the reflective wall.

11. The image display element according to claim 10, wherein the micro light emitting element further includes a light distribution control member on a light emitting surface.

12. The image display element according to claim 10, wherein the metal electrode and the reflective wall overlap each other in a plan view.

13. The image display element according to claim 10, wherein an area of a drive electrode on the driving circuit substrate to which the metal electrode is connected is less than an area of the metal electrode.

14. The image display element according to claim 10, wherein the excitation light emitting element further includes a plurality of the transparent electrodes.

15. The image display element according to claim 10, wherein an N-side layer included in the main body is disposed on the first side and a P-side layer included in the main body is disposed on the second side.

16. The image display element according to claim 10, wherein each of the micro light emitting elements further includes a resin layer disposed on the transparent portion between the reflective wall, wherein a refractive index of the resin layer is less than a refractive index of the transparent portion.

17. An image display element comprising:

micro light emitting elements disposed in an array on a driving circuit substrate including a driving circuit configured to supply a current to the micro light emitting elements and cause the micro light emitting elements to emit light, wherein each of the micro light emitting elements emits light in a direction opposite the driving circuit substrate, each of the micro light emitting elements includes an excitation light emitting element configured to generate excitation light, a reflective wall surrounding the excitation light emitting element, and a wavelength conversion material disposed inside the reflective wall, a sidewall of the reflective wall is not in contact with a sidewall of the excitation light emitting element and is inclined to open with respect to a light emission direction of each of the micro light emitting elements, the wavelength conversion material absorbs the excitation light and emits light having a wavelength longer than a wavelength of the excitation light, the wavelength conversion material covers all surfaces of the excitation light emitting element excluding a surface of the excitation light emitting element closer to the driving circuit substrate, and the excitation light emitting element includes a main body including a compound semiconductor, a metal electrode disposed on a first side of the main body relatively closer to the driving circuit substrate, and a transparent electrode disposed on a second side of the main body relatively farther from the driving circuit substrate, wherein a light emission layer included in the main body is disposed in a region of the main body close to the second side, a first drive electrode and a second drive electrode are provided on the driving circuit substrate, wherein the first drive electrode is provided between the drive circuit substrate and the metal electrode and is electrically connected to the metal electrode, and the second drive electrode is provided between the drive circuit substrate and the reflective wall and is electrically connected to the transparent electrode.

18. An image display element comprising:

micro light emitting elements disposed in an array on a driving circuit substrate including a driving circuit configured to supply a current to the micro light emitting elements and cause the micro light emitting elements to emit light, wherein each of the micro light emitting elements emits light in a direction opposite the driving circuit substrate, each of the micro light emitting elements includes an excitation light emitting element configured to generate excitation light, a reflective wall surrounding the excitation light emitting element, and a transparent portion disposed inside the reflective wall, a sidewall of the reflective wall is not in contact with a sidewall of the excitation light emitting element and is inclined to open with respect to a light emission direction of each of the micro light emitting elements, the transparent portion covers all surfaces of the excitation light emitting element excluding a surface of the excitation light emitting element located closer to the driving circuit substrate, and the excitation light emitting element includes a main body including a compound semiconductor, a metal electrode disposed on a first side of the main body relatively closer to the driving circuit substrate, and a transparent electrode disposed on a second side of the main body relatively farther from the driving circuit substrate, wherein a light emission layer included in the main body is disposed in a region of the main body close to the second side, a first drive electrode and a second drive electrode are provided on the driving circuit substrate, wherein the first drive electrode is provided between the drive circuit substrate and the metal electrode and is electrically connected to the metal electrode, and the second drive electrode is provided between the drive circuit substrate and the reflective wall and is electrically connected to the transparent electrode.

* * * * *